US008447246B2

(12) United States Patent
Oliaei et al.

(10) Patent No.: US 8,447,246 B2
(45) Date of Patent: May 21, 2013

(54) SYSTEM AND METHOD FOR A MULTI-BAND TRANSMITTER

(75) Inventors: Omid Oliaei, Tempe, AZ (US); David Newman, Tempe, AZ (US); Benjamin Gilsdorf, Phoenix, AZ (US); Patrick L. Rakers, Scottsdale, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 103 days.

(21) Appl. No.: 13/207,786

(22) Filed: Aug. 11, 2011

(65) Prior Publication Data

US 2013/0039438 A1    Feb. 14, 2013

(51) Int. Cl.
*H04B 1/04*          (2006.01)

(52) U.S. Cl.
USPC ....... 455/103; 455/552.1; 455/80; 455/127.1; 455/127.2; 455/553.1; 375/297

(58) Field of Classification Search
USPC .... 455/103, 552.1, 80, 127.2, 553.1; 375/297
See application file for complete search history.

(56) References Cited

U.S. PATENT DOCUMENTS

| | | | |
|---|---|---|---|
| 5,572,162 A | 11/1996 | Cotreau | 327/552 |
| 6,657,481 B2 | 12/2003 | Rasmussen et al. | 327/540 |
| 7,218,170 B1 | 5/2007 | Carter et al. | 327/552 |
| 7,660,571 B2 | 2/2010 | Chang et al. | 455/324 |
| 7,840,191 B2 * | 11/2010 | Mondal | 455/80 |
| 8,198,968 B2 * | 6/2012 | Oliaei et al. | 336/192 |
| 2004/0198420 A1 * | 10/2004 | He et al. | 455/552.1 |
| 2008/0205547 A1 * | 8/2008 | Rofougaran | 375/297 |
| 2009/0073070 A1 * | 3/2009 | Rofougaran | 343/793 |
| 2010/0027711 A1 | 2/2010 | Manku et al. | 375/295 |
| 2010/0248660 A1 * | 9/2010 | Bavisi et al. | 455/120 |
| 2010/0295599 A1 | 11/2010 | Uehara et al. | 327/355 |
| 2012/0164963 A1 * | 6/2012 | Rofougaran | 455/127.2 |

OTHER PUBLICATIONS

U.S. Appl. No. 12/882,306, filed Sep. 15, 2010, pp. 22.
Wikipedia; "Resistor ladder"; www.wikipedia.org; pp. 3, Jul. 14, 2011.
Wikipedia; "Balun"; www.wikipedia.org; pp. 4, Jul. 14, 2011.
Roy W. Lewallen; "Baluns: What They Do and How They Do It"; APRL Antenna Compendium, vol. 1; pp. 157-164, 1985.
Farazian et al. "A Dual-Band CMOS CDMA Transmitter Without External SAW Filtering"; IEEE Transactions on Microwave Theory and Techniques; vol. 58; No. 5; pp. 1349-1358, May 2010.
Farazian et al. "A Dual-Band CMOS CDMA Transmitter Without SAW and Driver Amplifier"; IEEE Radio Frequency Integrated Circuits Symposium; pp. 523-526, 2009.

* cited by examiner

*Primary Examiner* — Sanh Phu
(74) *Attorney, Agent, or Firm* — Baker Botts L.L.P.

(57) ABSTRACT

In accordance with some embodiments of the present disclosure, a multi-band transmitter comprises a plurality of band paths with each band path configured for a different frequency range. Each band path comprises a modulator configured to modulate a data signal onto a carrier signal associated with the frequency range of the band path to generate a radio frequency (RF) signal associated with the band path and frequency range of the band path. Each band path also comprises a step-down balun that includes an input coil configured to receive the RF signal from the modulator. Each band path further comprises a tuner configured to tune the input coil to the frequency range of the band path. The tuner is also configured to compensate for off-state conduction of switches of the tuner to reduce non-linear tuning effects of the balun associated with the off-state conduction.

18 Claims, 12 Drawing Sheets

SYSTEM AND METHOD FOR A MULTI-BAND TRANSMITTER

TECHNICAL FIELD

The present disclosure relates generally to wireless communications, including, without limitation, a system and method for a multi-band transmitter.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. A receiver is an electronic device which receives and processes a wireless electromagnetic signal. A transmitter and receiver may be combined into a single device called a transceiver.

Many transmitters may include a drive amplifier or gain stage that may increase the power of the transmitted signal, but also may increase the power consumption of the transmitter. Additionally, the bias voltage used to drive the components of a transmitter may experience various voltage drops across internal resistances of the transmitter that may reduce the voltage headroom of the transmitter. The voltage headroom may be associated with the amount of voltage used to drive components of the transmitter and may be affected by the power of a radio frequency (RF) signal communicated through the transmitter. Accordingly, the output power of an RF signal transmitted by the transmitter may be limited because a reduction in voltage headroom may negatively affect the performance of the transmitter. Further, current sinking through the internal resistances of the transmitter may increase the power consumption of the transmitter.

Many transmitters are also configured to transmit RF signals using a plurality of transmission protocols, where different design considerations may apply for the different transmission protocols. Additionally, transmitters may be configured to transmit RF signals over a broad frequency range, where different design considerations may apply for different frequencies within the frequency range.

SUMMARY

In accordance with some embodiments of the present disclosure, a multi-band transmitter comprises a plurality of band paths with each band path configured for a different frequency range. Each band path comprises a modulator configured to modulate a data signal onto a carrier signal associated with the frequency range of the band path to generate a radio frequency (RF) signal associated with the band path and frequency range of the band path. Each band path also comprises a step-down balun that includes an input coil coupled to the modulator and configured to receive the RF signal from the modulator. Each band path further comprises a tuner coupled to the input coil of the balun and configured to tune the input coil to the frequency range of the band path. The tuner is also configured to compensate for off-state conduction of switches of the tuner to reduce non-linear tuning effects of the balun associated with the off-state conduction.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
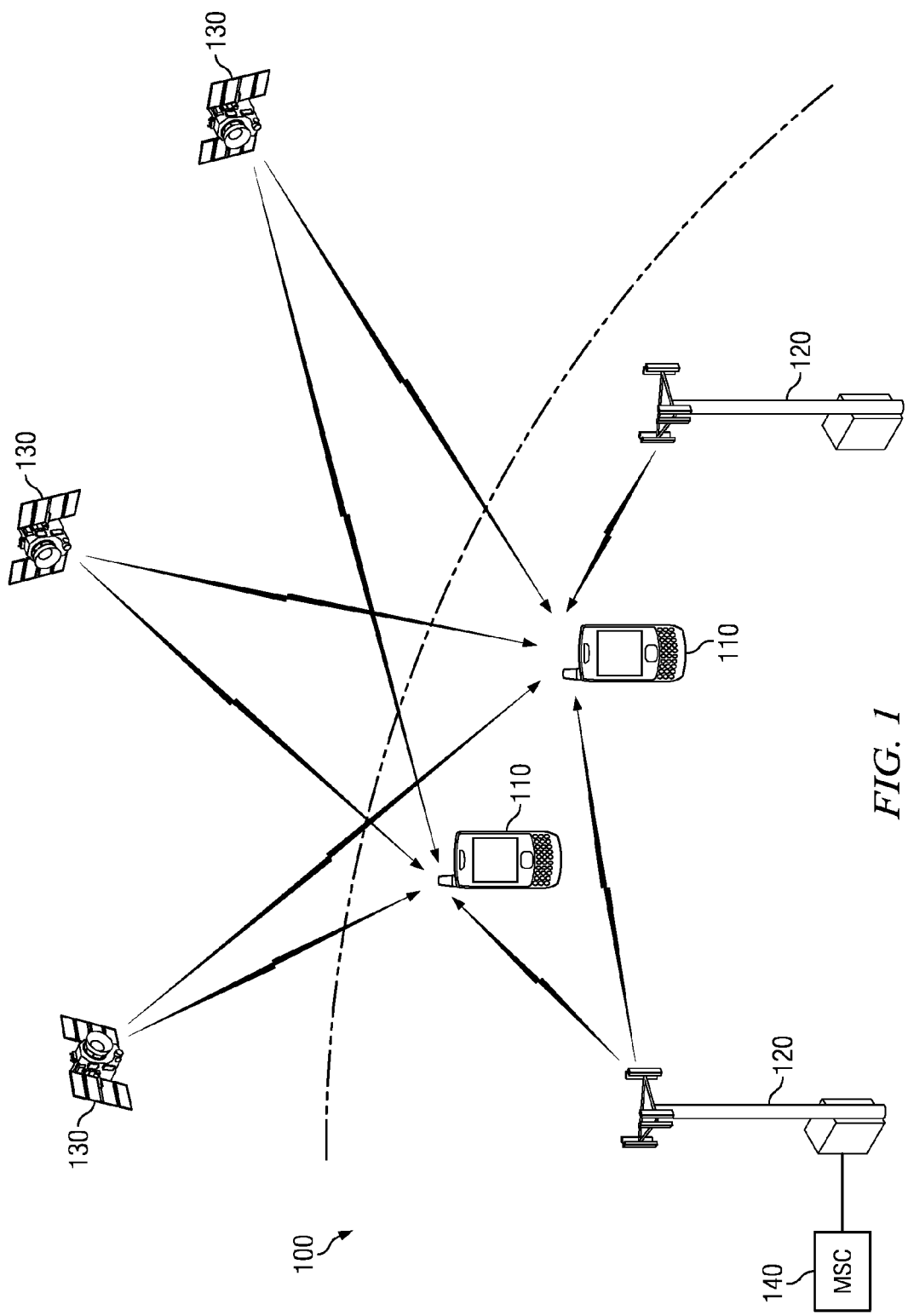
FIG. 1 illustrates a block diagram of an example wireless communication system, in accordance with some embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements of a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In general, a terminal 110 may receive signals from zero, one, or multiple transmitting sources at any given moment. In certain embodiments, a terminal 110 may also be a transmitting source that may transmit wireless communication signals to one or more receiving sources, such as a base station 120. As disclosed in further detail below, a transmitting source (e.g., a base station 120, a terminal 110, etc.) may include a transmitter that may be configured to have a varied supply voltage to adjust the power of the transmitted wireless communication signal. Additionally, the transmitter may include multiple DC current sources configured to drive various components of the transmitter to allow for more voltage headroom for increased signal power as disclosed in further detail below. Further, the transmitter may include multiple paths configured for different transmission protocols to improve the operation of the transmitter for each transmission protocol. Also, the transmitter may be configured as a multi-band transmitter.

System 100 may be a Code Division Multiple Access (CDMA) system, a Time Division Multiple Access (TDMA) system, some other wireless communication system, or any combination thereof. A CDMA system may implement one or more CDMA standards or protocols such as IS-95, IS-2000 (also commonly known as "1×"), IS-856 (also commonly known as "1×EV-DO"), Wideband-CDMA (W-CDMA), and so on. The W-CDMA standard is defined by a consortium known as 3GPP, and the IS-2000 and IS-856 standards are defined by a consortium known as 3GPP2. 3GPP may also include a 3GPP long-term evolution (LTE) standard. These different 3GPP standards may be referred to as third generation (3G) and/or fourth generation (4G) standards.

A TDMA system may implement one or more TDMA standards or protocols such as Global System for Mobile Communications (GSM). Additionally, variations in GSM may include an enhanced data rate for GSM evolution (EDGE) protocol and a general packet radio system (GPRS) protocol. These standards or protocols may be referred to as second generation (2G) protocols, in addition to a Gaussian minimum-shift-keying (GMSK) transmission protocol.

Figure 2:
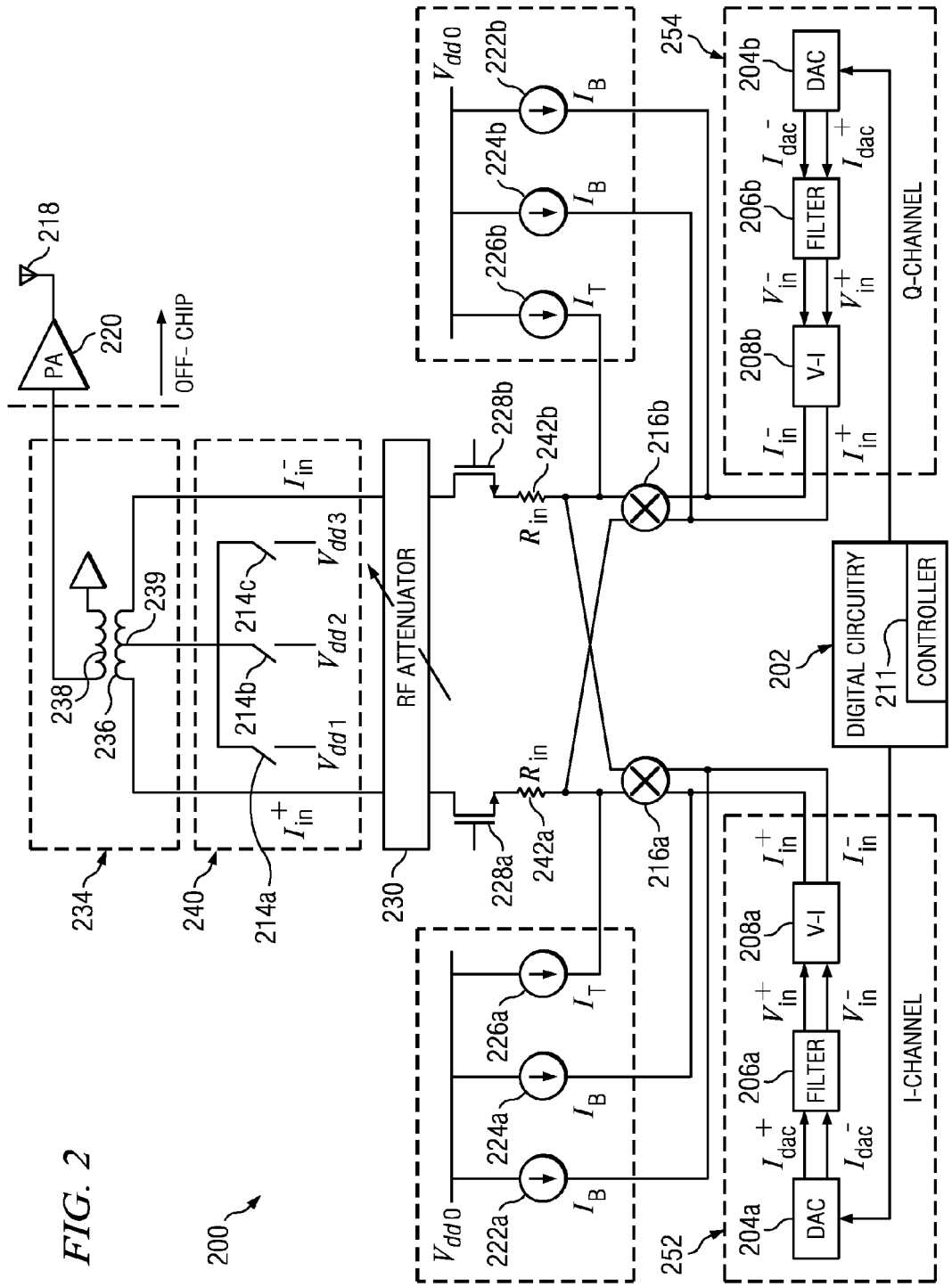
FIG. 2 illustrates a block diagram of selected components of an example transmitter that may be included in a wireless communication element, in accordance with some embodiments of the present disclosure.

FIG. 2 illustrates a block diagram of selected components of an example transmitter 200 that may be included in a wireless communication element (e.g., a terminal 110, a base station 120, or a satellite 130), in accordance with certain embodiments of the present disclosure. In some embodiments, the wireless communication element may also include a receiver, not expressly shown. Accordingly, depending on the functionality of the wireless communication element, the element may be considered a transmitter, a receiver, or a transceiver. As discussed in further detail below, transmitter 200 may be configured to allow for more voltage headroom during transmission of RF signals, even when the power of the RF signals may be increased. Additionally, transmitter 200 may be configured to reduce the power consumption of transmitter 200 as compared to traditional transmitters.

As depicted in FIG. 2, transmitter 200 may include digital circuitry 202. Digital circuitry 202 may include any system, device, or apparatus configured to process digital signals and information for transmission via transmitter 200. Such digital circuitry 202 may include one or more microprocessors, digital signal processors, and/or other suitable devices. In the present embodiment, digital circuitry 202 may include a controller 211. As disclosed in further detail below, controller 211 may be configured to communicate control signals to switches 214 (described below) to adjust the bias voltage of a balun 234 of transmitter 200.

Controller 211 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, controller 211 may interpret and/or execute program instructions and/or process data stored in memory communicatively coupled to controller 211 (not expressly shown).

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to controller 211 is turned off.

Digital circuitry 202 may be configured to transmit components of a signal via an in-phase (I-channel) path 252 and a quadrature-phase (Q-channel) path 254. I-channel path 252 may carry in-phase components of the signal and Q-channel path 254 may carry the quadrature components of the signal that may be 90° out of phase with the I-channel components of the signal. The signal may include data and or information that may be transmitted by transmitter 200 and thus may be referred to as a data signal.

I-channel path 252 and Q-channel path 254 may each include a digital-to-analog converter (DAC) 204. In the present example, each DAC 204 may comprise a current-mode DAC. Accordingly, each DAC 204 may be configured to receive a digital data signal from digital circuitry 202 and convert such digital signal into an analog current signal. In the present example, each DAC 204 may be configured to output a differential current signal represented by a positive polarity current $I_{dac}^+$ and a negative polarity current $I_{dac}^-$. Such analog differential current signal may then be passed to one or more other components of transmit path 201, including filters 206. Filters 206 may comprise any suitable system, apparatus or device configured to filter out noise in the differential current signal that may be caused by a DAC 204. Additionally, during filtering, filters 206 may convert the differential current signal into a differential voltage signal represented by a positive polarity voltage $V_{in}^+$ and a negative polarity voltage $V_{in}^-$. After passing through filters 206, the differential voltage signals associated with the I and Q channels may each pass to a voltage to current (V-I) converter.

Each V-I converter 208 may comprise any suitable system, apparatus or device configured to convert the received differential voltage signal into a differential current signal with positive polarity current $I_{in}^+$ and negative polarity current $I_{in}^-$. In some embodiments (e.g., when filters 206 comprise active filters that may insert their own noise), and as described further with respect to FIG. 3, a V-I converter 208 may include a passive filter (not expressly shown in FIG. 2) configured to filter out noise that may be caused by a filter 206. V-I converters 208 may also be configured to output the differential current data signal.

After leaving V-I converters 208 and 208b, respectively, the I-channel and Q-channel differential current signals may be received by mixers 216a and 216b, respectively. Mixers 216 may be configured to modulate the differential current data signals on a carrier signal to create a differential RF current signal. Following modulation by mixers 216, the I and Q channel signal components may be combined. Accordingly, the positive polarity RF current $I_{in}^+$ may be received by a transistor 228a where $I_{in}^+$ includes both the I and Q channel positive polarity signal components. Similarly, the negative polarity RF current $I_{in}^-$ may be received by transistor 228b, where $I_{in}^-$ includes both the I and Q channel negative polarity RF signal components. Transistors 228 may be configured such to provide isolation between relatively large voltage swings on balun 234 (described further below) and mixers 216.

In some embodiments and as described further below, the differential RF current signal may be received by RF attenuator 230 configured to attenuate the RF signal when enabled. Attenuator 230 may attenuate the RF signal based on a control signal received from controller 211 such that, according to the control signal, attenuator 230 may adjust the power of the RF signal. As described further with respect to FIGS. 3, 4 and 5 below, attenuator 230 may be configured in parallel with a balun 234 configured to receive the differential RF current signal.

Balun 234 may comprise any suitable system, apparatus or device configured to convert differential signals into single-ended signals and vice versa. In the present example, balun 234 may comprise a transformer that includes an input coil 236 and an output coil 238. Additionally, in the present embodiment, balun 234 may comprise a step-down transformer, such that the turn ratio at input coil 236 may be larger than the turn ratio at output coil 238. The larger turn ratio at input coil 236 may cause input coil 236 to have an increased input impedance (e.g., 600 ohms), which may allow for larger swings of the RF signal. The smaller turn ratio at output coil 238 may cause output coil 238 to have a reduced output impedance (e.g., 50 ohms) such that an impedance matching circuit between output coil 238 and power amplifier 220 may not be necessary.

Input coil 236 of balun 234 may receive $I_{in}^+$ and $I_{in}^-$ of the differential RF current signal and as the differential RF current signal passes through input coil 236, output coil 238 may generate a single-ended RF signal that may be communicated to a power amplifier 220. Power amplifier (PA) 220 may amplify the single-ended RF signal for transmission via antenna 218.

The power of the RF signal transmitted from output coil 238 to power amplifier 220 may be at least a function of the RF differential current flowing through output coil 238, which may be a function of the RF current flowing through input coil 236. Accordingly, the power of an RF signal that may be output at output coil 238 may be adjusted by adjusting at least the differential RF current passing through input coil 236, which may be adjusted by attenuator 230. In some embodiments, attenuator 230 may comprise a digital voltage-controlled attenuator (DVCA).

Figure 3:
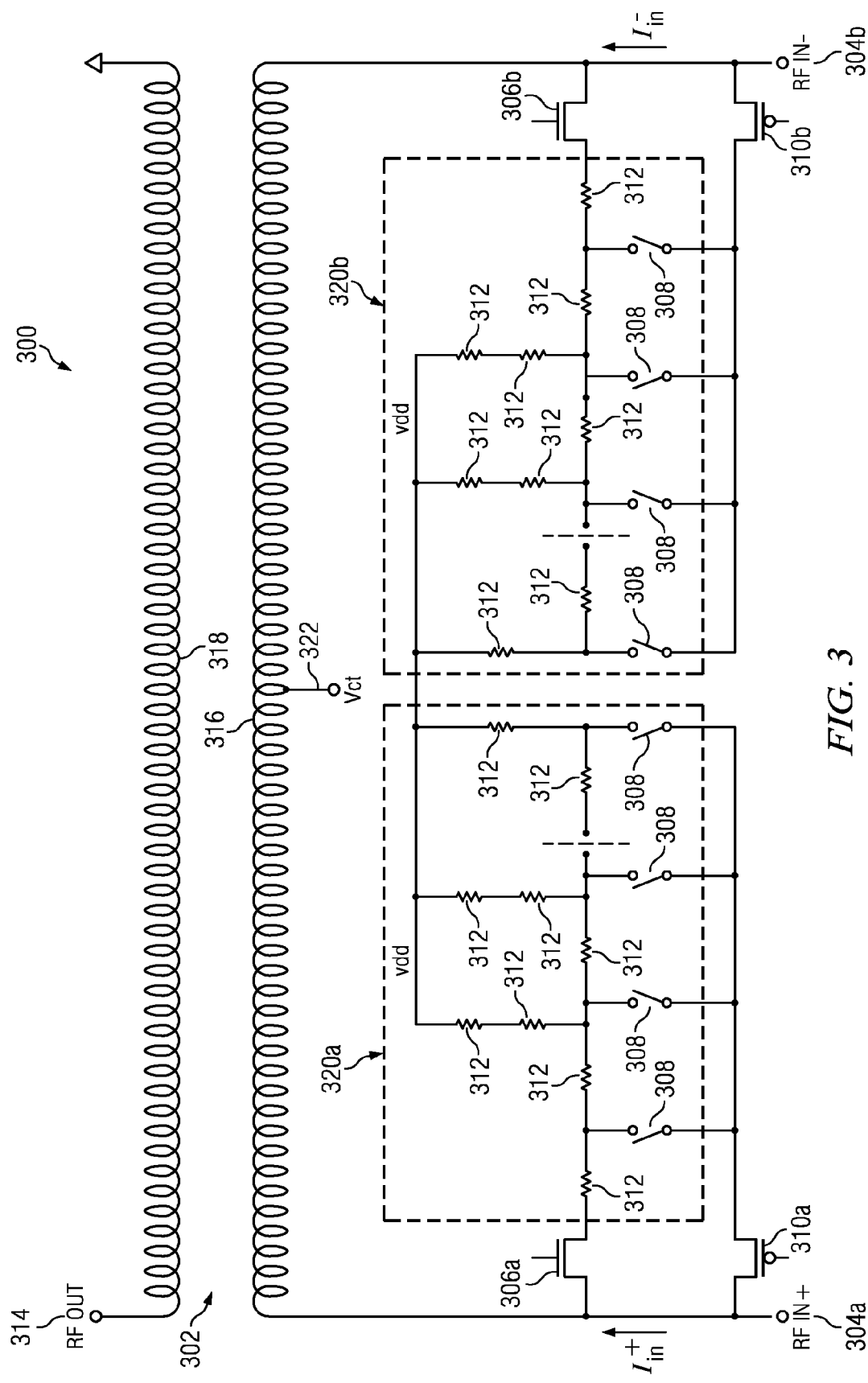
FIG. 3 illustrates an example of a digital voltage-controlled attenuator (DVCA) coupled in parallel with a balun, in accordance with some embodiments of the present disclosure.

FIG. 3 illustrates an example of a DVCA 300 coupled in parallel with a transformer 302 that may act as a balun, in accordance with certain embodiments of the present disclosure. In some embodiments, attenuator 230 of FIG. 2 may comprise DVCA 300 and/or balun 234 of FIG. 2 may comprise transformer 302. DVCA 300 and transformer 302 may be used to control the power of a transmitted RF signal.

As mentioned above, in the present example DVCA 300 may be placed in parallel with transformer 302, which may act as a balun. In the present example, transformer 302 may include an input coil 316 similar to input coil 236 of balun 234 in FIG. 2. Transformer 302 may also include an output coil 318 similar to output coil 238 of balun 234 in FIG. 2. Input coil 316 may include input ports 304a and 304b configured to receive a positive differential current $I_{in}^+$ and a negative differential current $I_{in}^-$, respectively, of an RF signal received from mixers configured to modulate the RF signal (e.g., mixers 216 of FIG. 2). Additionally, input coil 316 may be coupled to a center tap voltage (Vct) 322 that may bias input coil 316 at an appropriate voltage to allow sufficient voltage headroom for the transmitter associated with DVCA 300, as discussed in greater detail below. Output coil 318 may include an output port 314 configured to output the RF signal as a single-ended RF signal. In the present example, output port 314 may be coupled to a power amplifier (e.g., power amplifier 220 of FIG. 2) such that the RF signal may be communicated to the power amplifier from output port 314.

As disclosed further below, DVCA 300 may be enabled and disabled to dissipate at least a portion of the power of the RF signal received at input ports 304a and 304b by drawing at least a portion of the RF differential current away from input coil 316. DVCA 300 may also be configured to draw differing amounts of RF differential current through DVCA 300 by varying its impedance (as experienced by the RF signal) such that a portion of the power of the RF signal received at input ports 304a and 304b may be dissipated within DVCA 300 according to the varied impedance. Therefore, the current passing through input coil 316 and output coil 318 may vary according to the impedance changes of DVCA 300 such that the power of the RF signal output at output port 314 may be varied.

DVCA 300 may include switches 306 and 310 coupled to input ports 304 of input coil 316. In the present embodiment, switches 306 may comprise n-type metal-oxide-semiconductor field-effect transistors (NMOS) and switches 310 may comprise p-type metal-oxide-semiconductor field-effect transistors (PMOS) configured to open and close according to a control signal sent from a controller, such as controller 211 of FIG. 2. Switches 306a and 306b may close in response to receiving a "HIGH" control signal at their respective gates and may open in response to receiving a "LOW" control signal due to switches 306a and 306b being NMOS devices in the present example. Switches 310a and 310b may close in response to receiving a "LOW" control signal and may open in response to receiving a "HIGH" control signal at their respective gates due to switches 310a and 310b being PMOS devices in the present example.

In instances where no attenuation of the RF signal is desired, switches 306 and 310 may be opened to decouple DVCA 300 from input coil 316 such that no RF differential current is drawn through DVCA 300. Therefore, DVCA 300 may be disabled and all the RF current may be drawn through input coil 316 and output coil 318 such that all of the power of the RF signal may be output at output node 314.

To provide further power control, DVCA 300 may be enabled in some instances. DVCA 300 may be enabled by switches 306 and 310 receiving control signals from a controller (e.g., controller 211) to close switches 306 and 310. As such, at least a portion of the RF signal received at input ports 304 may pass through DVCA 300 (e.g., in the present example a portion of the RF differential current may pass through DVCA 300) such that less RF power may be transferred to output port 314 (e.g., less RF current may pass through coils 316 and 318, thus reducing the power of the RF signal output at output port 314).

Further, the impedance of DVCA 300 may also be adjusted such that the RF differential current, and consequently the RF power passing through DVCA 300 may be adjusted. For example, DVCA 300 may include an R2R resistor ladder 320a associated with the positive differential RF current and DVCA 300 may include an R2R resistor ladder 320b associated with the negative differential RF current. Each R2R ladder 320 may include one or more resistors 312 and one or more switches 308 that may open and close according to control signals received from a controller (e.g., controller 211). Each switch 308 may be configured to open or close to decouple or couple, respectively one or more resistors 312 with a path that may be followed by the RF signal through DVCA 300. In the present example, switches 308 may comprise PMOS devices, however any other suitable system, apparatus or device may be used for switches 308.

Therefore, as each switch 308 opens and/or closes the overall impedance of DVCA 300, with respect to the RF signal passing through DVCA 300, may change such that the RF current passing through DVCA 300 may change. As mentioned above, the RF power may be a function of the RF current. Accordingly, the amount of RF signal power dissipated through DVCA 300 (instead of passing through input coil 316) may be a function of the impedance of DVCA 300, which may be based on the opening and closing of switches 308. As such, a controller may adjust the attenuation of an RF signal output at output port 314 by opening and/or closing the appropriate switches 308. Additionally, in some instances, a controller (e.g., controller 211 of FIG. 2) may reduce Vct 322 to be set at the supply voltage (Vdd) of DVCA 300 when DVCA 300 is enabled, as disclosed in further detail below. Vct 322 may be reduced when DVCA 300 is enabled because the bias voltage at input coil 316 may not need to be as high due to the lower power of the RF signal. Such a configuration may allow for a more linear adjustment of RF signal power over a larger dynamic range of RF signal power attenuation than traditional RF signal attenuation configurations.

Modifications, additions or omissions may be made to the system of FIG. 3 without departing from the scope of the present disclosure. For example, although the present embodiment depicts DVCA 300 in parallel with a transformer 302 acting as a balun, it is understood that DVCA 300 may be placed in parallel with any suitable balun to achieve a linear attenuation over a larger dynamic range. Additionally, although switches 306 and 310 are depicted specifically as NMOS and PMOS devices, respectively, it is understood that any suitable switch may be used to perform the switching functions performed by switches 306 and 310. Also, switches 306 may comprise PMOS devices and switches 310 may comprise NMOS devices or any combination thereof. Additionally, as described in FIG. 4, in some instances, switches 310 may be omitted.

Figure 4:
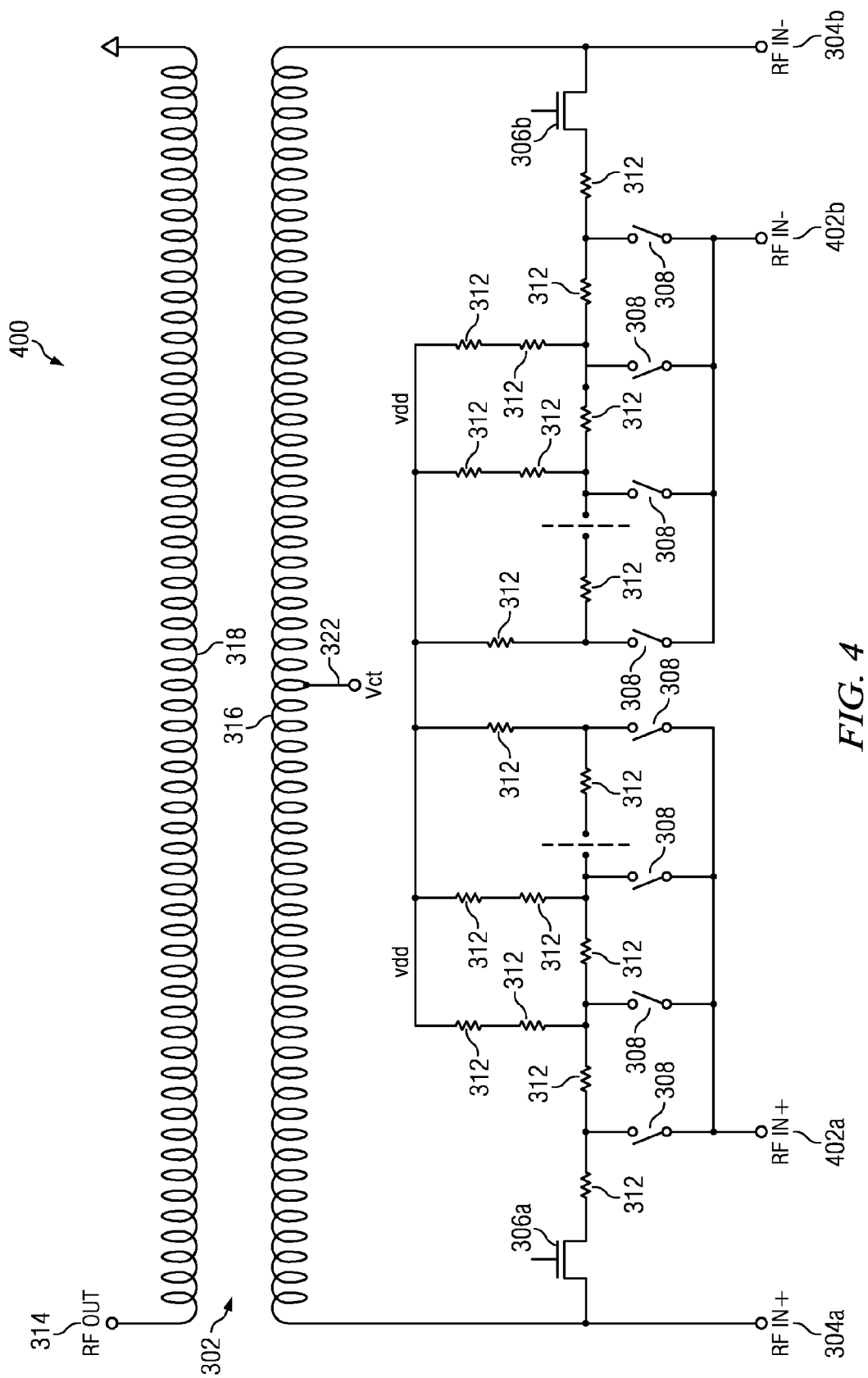
FIG. 4 illustrates another example of a DVCA in accordance with some embodiments of the present disclosure.

FIG. 4 illustrates another example of a DVCA 400 in accordance with the present disclosure. FIG. 4 may include transformer 302 with input coil 316 and output coil 318 as described with respect to FIG. 3. Additionally, input coil 316 may include input ports 304 configured to receive the differential RF current of an RF signal, as described with respect to FIG. 3. Further, similarly to that described in FIG. 3, input coil 316 may be communicatively coupled to a center tap voltage Vct 322 at approximately the center of input coil 322 to bias input coil 316.

Similar to the description of FIG. 3, DVCA 400 may be placed in parallel with transformer 302. DVCA 400 may include switches 306 configured to enable and disable DVCA 400 by closing and opening, respectively, such that DVCA 400 may be coupled to or decoupled from transformer 302, as described above. DVCA 400 may also include resistors 312 and switches 308 configured to open and close to vary the impedance of DVCA 400 as described with respect to FIG. 3.

However, unlike DVCA 300 of FIG. 3, DVCA 400 of FIG. 4 may include input terminals 402a and 402b configured to receive the positive and negative differential currents, respectively, of an RF signal. Accordingly, DVCA 400 may not include switches 310 shown in FIG. 3. In the current embodiment of DVCA 400, the RF signal received at input terminals 402a and 402b may be generated by the same RF signal source as the RF signal that may be received at ports 304a and 304b. In other embodiments, the RF signal received at terminals 402a and 402b may be generated by a different source than the source that may generate the RF signal received at ports 304a and 304b. The RF signal source or sources may comprise mixers such as mixers 216 of FIG. 2.

In instances where no attenuation due to DVCA 400 is desired, a controller (e.g., controller 211) may open switches 306 and may also direct the RF signal to ports 304a and 304b. In such instances, the controller may also direct that no RF signal is sent to terminals 402 of DVCA 400. In instances where attenuation due to DVCA 400 is desired, a controller (e.g., controller 211) may close switches 306 and may also direct that the RF signal is sent to terminals 402 of DVCA 400. In such instances, the controller may also direct that no RF signal is sent to ports 304. The RF signal may be directed between input ports 304 and input terminals 402 by cascoded devices (e.g., CMOS devices) coupled to the RF signal source and configured to steer the RF current into either input ports 304 or input terminals 402 depending on whether DVCA 300 is disabled or enabled, respectively. As described above, with DVCA 400 enabled, different switches 308 may be opened or closed to adjust the impedance of DVCA 400 such that the power of the RF signal being output at output port 314 may be adjusted. Accordingly, DVCA 400 may be configured to adjust the attenuation of an RF signal. Further, by including input terminals 402 in DVCA 400 instead of switches 310 in DVCA 300, possible insertion loss due to switches 310 may be avoided.

Modifications, additions or omissions may be made to the system of FIG. 4 without departing from the scope of the present disclosure. For example, although the present embodiment depicts DVCA 400 in parallel with a transformer 302 acting as a balun, it is understood that DVCA 400 may be placed in parallel with any suitable balun to achieve a linear attenuation over a larger dynamic range than traditional attenuation configurations. Additionally, although switches 306 are depicted specifically as NMOS, it is understood that any suitable switch may be used to perform the switching functions performed by switches 306. For example, in some embodiments, switches 306 may comprise PMOS devices instead of NMOS devices. Additionally, as described with respect to FIG. 5, in some instances DVCA 400 may be configured to compensate for possible current leakage through switches 308.

Figure 5:
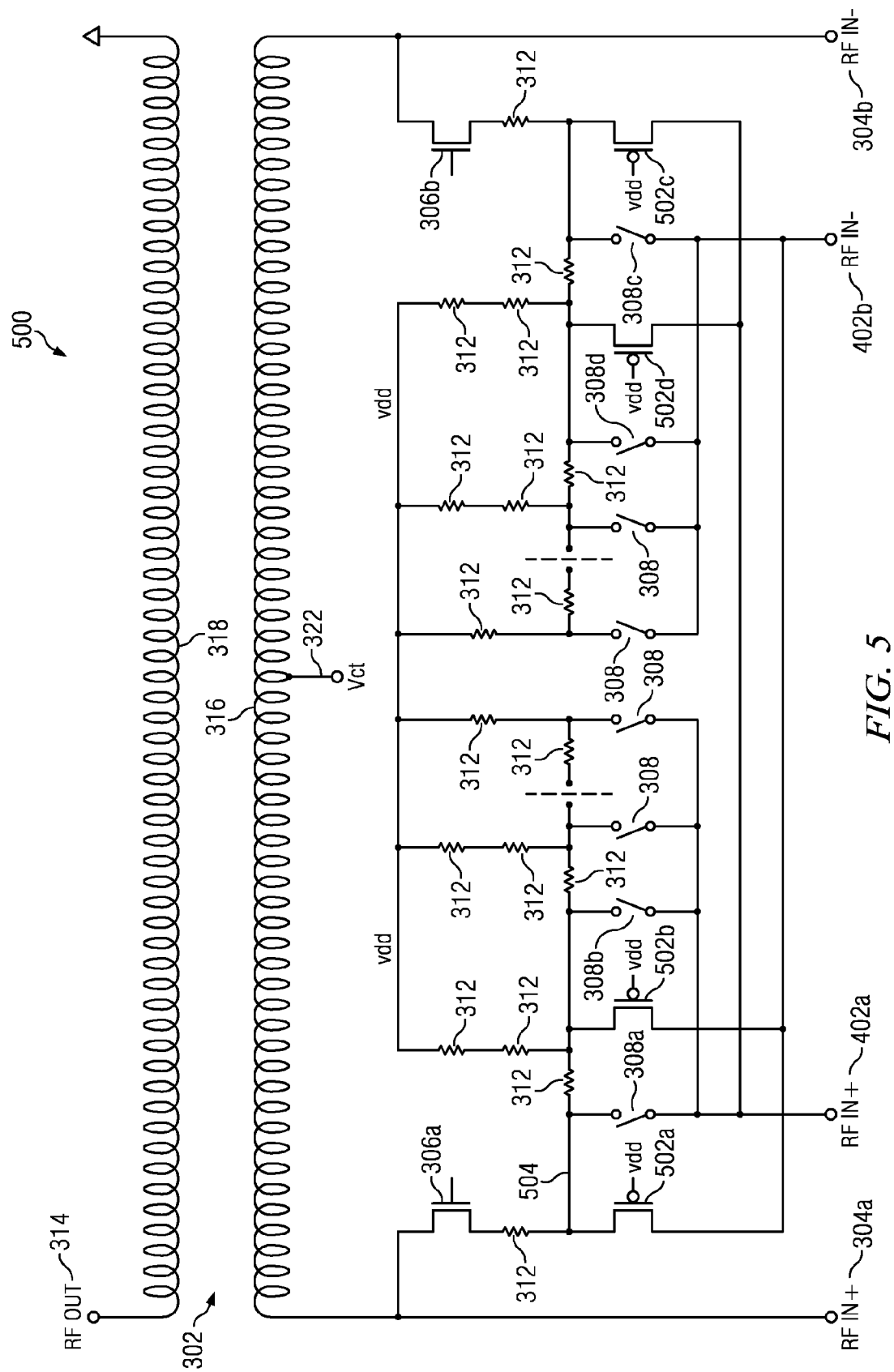
FIG. 5 illustrates an example of a DVCA with leakage cancellation, in accordance with some embodiments of the present disclosure.

FIG. 5 illustrates an example of a DVCA 500 with leakage cancellation, in accordance with certain embodiments of the present disclosure. DVCA 500 may be coupled in parallel with input coil 316 of transformer 302 as described above with respect to DVCA 300 and DVCA 400 in FIGS. 3 and 4, respectively. Additionally, DVCA 500 may be substantially similar to DVCA 400 of FIG. 4, however, unlike DVCA 400, DVCA 500 may be configured to compensate for any current leakage that may occur through switches 308 when switches 308 are opened and DVCA 500 is enabled.

Similarly to DVCA 400, DVCA 500 may be enabled by closing switches 306. Additionally, input terminals 402 of DVCA 500 may receive the RF signal when DVCA 500 is enabled. As described above, to adjust the impedance of DVCA 500, switches 308 may be opened or closed. However, when switches 308 are opened, some current may leak through one or more of the open switches 308, thus causing those switches to not act as if they are completely open.

Accordingly, DVCA 500 may include one or more dummy switches 502 that may compensate for some or all of the current leakage that may pass through a respective switch 308 when the switch 308 is "open." For example, dummy switch 502a may be associated with switch 308a and may be configured to compensate for current leakage through switch 308a when switch 308a is "open." Dummy switches 502b, 502c and 502d may be similarly associated with switches 308b, 308c and 308d respectively. In the present example, dummy switches 502 may comprise PMOS devices with their gates tied to source voltage vdd such that dummy switches 502 may always be turned off. In alternate examples, one or more of dummy switches 502 may comprise NMOS devices with their gates tied to ground such that the NMOS dummy switches 502 may also always be turned off.

Dummy switches 502 may be configured to have leakage currents that may have an opposite polarity from the polarity of the leakage currents flowing through an associated switch 308. Accordingly, the leakage currents of dummy switches 502 may be used to partially or fully cancel leakage current of an associated switch 308.

For example, switch 308a may be coupled at one end to a node 504 of DVCA 500 also and may be coupled to input terminal 402a at its other end. As mentioned above, input terminal 402a may be configured to receive the positive differential RF current of the RF signal when DVCA 500 is enabled. Accordingly, any leakage current that may pass through switch 308a from input terminal 402a to node 504 may have a positive polarity. Additionally, dummy switch 502a may be coupled at one end to node 504 of DVCA 500 and may be coupled to input terminal 402b at its other end. As mentioned above, input terminal 402b may be configured to receive the negative differential RF current of the RF signal when DVCA 500 is enabled. Thus, any leakage current that may pass through dummy switch 502a from input terminal 402b to node 504 may have a negative polarity, which may be opposite of the positive polarity of the leakage current associated with switch 308a. Further, dummy switch 502a may be sized such that the amount of leakage current that may flow through dummy switch 502a may be approximately the same as the amount of leakage current passing through switch 308a.

Consequently, with the leakage currents associated with switches 502a and 308a at node 504 being approximately equal and having opposite polarities, the leakage currents may partially or fully cancel each other out. Dummy switches 502b, 502c and 502d may be similarly configured with respect to switches 308b, 308c, and 308d. Consequently, DVCA 500 may be configured to adjust the power of the RF signal output at output port 314 similarly to DVCA 400 described with respect to FIG. 4 and may also be configured to compensate for current leakage that may occur through switches 308.

Modifications, additions or omissions may be made to DVCA 500 without departing from the scope of the present disclosure. For example, although the present embodiment depicts DVCA 500 in parallel with a transformer 302 acting as a balun, it is understood that DVCA 500 may be placed in parallel with any suitable balun to achieve a linear attenuation over a larger dynamic range than traditional attenuation configurations. Additionally, although switches 306 are depicted specifically as NMOS, it is understood that any suitable switch may be used to perform the switching functions performed by switches 306. For example, in some embodiments, switches 306 may comprise PMOS devices instead of NMOS devices. Further, although a certain number of dummy switches 502 are depicted as being associated with a certain number of switches 308, more or fewer dummy switches 502 may be included in DVCA 500 depending on the system characteristics and requirements of DVCA 500.

Returning to FIG. 2, in addition to including an attenuator 230 in some instances to adjust RF signal power, transmitter 200 may be configured to adjust a bias voltage of balun 234 according to the RF signal power received at input coil 236. Input coil 236 of balun 234 may include a center tap node 239 that may be coupled to a supply voltage selector circuit 240 that may provide a center tap bias voltage Vct to center tap node 239. Voltage selector 240 may include a plurality of switches 214 each coupled between center node 239 and a supply voltage $Vdd_i$ that may provide center tap voltage Vct. As mentioned previously, the power of an RF signal may cause voltage swings that may affect the voltage used to drive various components of transmitter 200. The voltage used to drive the components may be referred to as voltage headroom. Vct may be configured to provide a bias voltage that raises the overall voltage of the RF signals propagating through transmitter 200 such that even with the voltage swings associated with the RF signal, substantial voltage headroom is present to properly drive the components of transmitter 200. However, a higher bias voltage Vct may use more power. Accordingly, as discussed below, voltage selector 240 may be configured to adjust the bias voltage according to the RF signal power, such that in instances where the RF signal power is lower, Vct may be lowered to reduce power consumption, but also such that Vct may be raised when RF signal power is raised to allow for enough headroom that transmitter 200 may function properly.

In the present example, voltage selector 240 may include a switch 214a coupled between a supply voltage $Vdd_1$ and center node 239, a switch 214b coupled between a supply voltage $Vdd_2$ and center node 239, and a switch 214c coupled between a supply voltage $Vdd_3$ and center node 239. It is understood that voltage selector 240 may include more or fewer switches 239 and supply voltages $Vdd_i$, depending on the design characteristics and parameters of transmitter 200.

Switches 214 may be communicatively coupled to controller 211 (coupling not expressly shown) and may be configured to open and close according to a control signal received from controller 211 to decouple or couple, respectively their associated supply voltage $Vdd_i$ with center node 239. For example, switch 214a may be configured to open according to a control signal received from controller 211 to decouple supply voltage $Vdd_1$ from center node 239. Additionally, switch 214a may be configured to close according to a control signal received from controller 211 to couple supply voltage $Vdd_1$ to center node 239. In the present example switches 214 may comprise PMOS transistors that are configured to close upon receiving a "LOW" signal from controller 211 and open upon receiving a "HIGH" signal from controller 211.

Supply voltages $Vdd_i$ may have different voltage values, such that the bias voltage (at center node 239) may vary depending on which supply voltage $Vdd_i$ may be coupled to center node 239. For example, supply voltage $Vdd_1$ may have a higher voltage than supply voltage $Vdd_2$, and supply voltage $Vdd_2$ may have a higher voltage than supply voltage $Vdd_3$. Therefore, in the current example, the bias voltage, Vct, at center node 239 may be at its highest when supply voltage $Vdd_1$ is coupled to center node 239, the bias voltage at center node 239 may have an intermediate voltage when supply voltage $Vdd_2$ is coupled to center node 239, and the bias voltage at center node 239 may be at its lowest when supply voltage $Vdd_3$ is coupled to center node 239.

Accordingly, Vct may be adjusted by opening and closing particular switches 214 to couple a particular Vdd$_i$ with center node 239 based at least partially on the RF signal power and the desired amount of headroom. For example, if a large amount of RF signal output power is passing through balun 234, controller 211 may communicate a "LOW" signal to switch 214a to close switch 214a such that Vdd$_1$ is coupled to center node 239 to allow for more voltage headroom. Additionally, controller 211 may communicate a "HIGH" signal to switches 214b and 214c such that supply voltages Vdd$_2$ and Vdd$_3$ are not coupled to center node 239. If the RF signal has less power, controller 211 may determine that Vct may be at Vdd$_2$ to provide enough headroom and, thus, may close switch 214b and open switches 214a and 214c such that transmitter 200 may consume less power while also having enough headroom. Additionally, if the RF signal has even less power, controller 211 may determine that Vct may be at Vdd$_3$ and, thus, may close switch 214c open switches 214a and 214b to reduce the power consumption of transmitter 200.

In embodiments that include an attenuator 230, controller 211 may vary Vct according to whether or not attenuator 230 is enabled. For example, in instances where attenuator 230 is enabled, the RF signal power at input coil 236 may be reduced, such that Vct may be reduced. In the present example, Vct is depicted as being selected between three distinct supply voltages Vdd$_i$, however, it is understood that Vct may be selected between more or fewer supply voltages and in other instances may be adjusted on a sliding scale instead of a discreet scale.

Accordingly, voltage selector 240 and controller 211 may be configured to adjust the bias voltage at center point 239 based at least partially on the power of the RF signal propagating through transmitter 200. As such, transmitter 200 may be configured to be more efficient and may reduce its overall power consumption.

Transmitter 200 may also be configured to reduce the current drain from balun 234 to improve the power efficiency of transmitter 200. Additionally, by reducing the current drain from balun 234, the direct current (DC) voltage drop between the bias voltage, Vct, at input coil 236 and other components of transmitter 200 may be reduced. By reducing the voltage drop between these components, the voltage headroom used to drive these components may be substantially high enough to maintain proper operation of the components.

The RF current signal ($I_{in}^+$ and $I_{in}^-$) propagating from converters 208 to balun 234 may be biased with a DC current ($I_{dc}$) and may also include positive and negative polarity alternating current (AC) signal components ($I_{sig}^+$ and $I_{sig}^-$). The bias current, $I_{dc}$, of $I_{in}$ may be related to a constant source current $I_0$ and gain constant "M" associated with converters 208 and described in further detail below with respect to FIGS. 7 and 8. In the present example, the relationship between $I_{dc}$, $I_0$ and M may be represented by the following equation:

$$I_{dc} \approx M \ast I_0.$$

In the present example, $I_{dc}$ may be sourced at least partially by bias voltage Vct at center node 239 of balun 234. However, internal resistance may exist in the paths from center node 239 to converters 208. Without compensating for it, this internal resistance may cause the bias voltage at different nodes of transmitter 200 to be reduced, which may reduce the voltage headroom for driving the components at those nodes below an acceptable level. Additionally, if the effect of the internal resistance is not compensated for, the loss of power as current flows from Vct through the internal resistance may reduce the efficiency of transmitter 200. Accordingly, transmitter 200 may include multiple current sources configured to inject current into various nodes along the path between converters 208 and balun 234 such that bias voltage Vct may not be sole source of bias current $I_{dc}$. Therefore, as explained further below, the bias voltage drop across the internal resistances may be reduced such that the bias voltage at various nodes of transmitter 200 may be sufficiently high to allow for an appropriate amount of headroom. The increased headroom may also improve the linearity of the components. Further, by injecting current into various nodes, transmitter 200 may be configured such that less power is consumed by reducing the amount of current being sourced by Vct and passing through the internal resistance of transmitter 200.

For example, transmitter 200 may include an internal resistance $R_{in}$ between transistors 228 and mixers 216. In the present disclosure internal resistance $R_{in}$ may be represented by resistors 242 coupled between transistors 228 and mixers 216. Accordingly, transmitter 200 may include a current source 226a coupled close to the output of mixer 216a such that most, if not all, of the internal resistance $R_{in}$ between current source 226a and mixer 216a is bypassed by the current ($I_T$) of current source 222a. In the present example, this configuration is depicted with current source 226a coupled at the node between resistor 242a and the output of mixer 216a. Transmitter 200 may include a current source 226b similarly configured with respect to transistor 228b, mixer 216b and the internal resistance between transistor 228b and mixer 216b, as represented by resistor 242b.

In the present example, the bias current, $I_{dc}$ passing from transistor 228a to mixer 216a may include the sum of the bias current sourced by balun 234 ($I_{balun}$) and the current sourced by current source 226a ($I_T$). This relationship may be expressed by the following equation:

$$I_{dc} \approx I_{balun} + I_T$$

As mentioned above, $I_{dc}$ may be set by $I_0$ and "M" such that as $I_T$ increases the required amount of $I_{balun}$ may decrease. Additionally, the voltage drop across the internal resistance $R_{in}$ (represented by resistor 242a) may be a function of $I_{balun}$ due to Ohm's law. Accordingly, by injecting current $I_T$ at the output of mixer 216a, the bias voltage at the output of mixer 216a may be raised because of less of a voltage drop across the internal resistance (e.g., resistor 242a). As such, more voltage headroom may be available to achieve a more linear operation of mixer 216a when the RF signal power is increased. Further, due to less current passing through the internal resistance, power loss through the internal resistance may be reduced. Additionally, current source 226a may be driven by a constant source voltage Vdd$_o$ that may have a lower voltage than Vct at center node 239. With the lower voltage sourcing the current, the amount of power used by current source 226a may also be reduced as compared to situations where $I_{dc}$ may be sourced by Vct. Similar principles may apply to current source 226b sourcing current $I_T$ to mixer 216b.

As further examples, in the present embodiment, transmitter 200 may include current sources 222 and 224 configured to provide a bias current $I_B$ at the positive and negative polarity outputs of converters 208. For example, current source 222a may provide a bias current at the negative polarity output of converter 208a associated with the I-channel of transmitter 200. Additionally, current source 224a may provide a bias current at the positive polarity output of converter 208a. Similar to internal resistance $R_{in}$, an internal resistance (not expressly shown) may also exist between mixers 216 and converters 252. Accordingly, current sources 222 and 224 may be coupled close to the outputs of converters 208 such that most, if not all, of the internal resistance between each mixer 216 and converter 208 is bypassed by bias currents $I_B$ sourced by current sources 222 and 224. Similar to current sources 226, current sources 222 and 224 may source at least a portion of the bias current drawn at the output of converters 208, such that a voltage drop between mixers 216 and converters 208 may be reduced. Accordingly, converters 208 may function in a more linear manner for increased RF signal power due to the voltage at the output of converters 208 being maintained at a higher level to maintain an appropriate amount of headroom. Further, power may be conserved by not sinking as much current through the internal resistance between mixers 216 and converters 208. Also, current sources 222 and 224 may consume less power as they may be sourced by supply voltage $Vdd_0$, which may be lower than Va.

Modifications, additions or omissions may be made to FIG. 2 without departing from the scope of the present disclosure. For example, although a certain number of components are depicted in a particular manner, it is understood that more or fewer components may be included in transmitter 200. Additionally, transmitter 200 and its components may have various different configurations. FIGS. 6-12 illustrate some of these different configurations.

Figure 6:
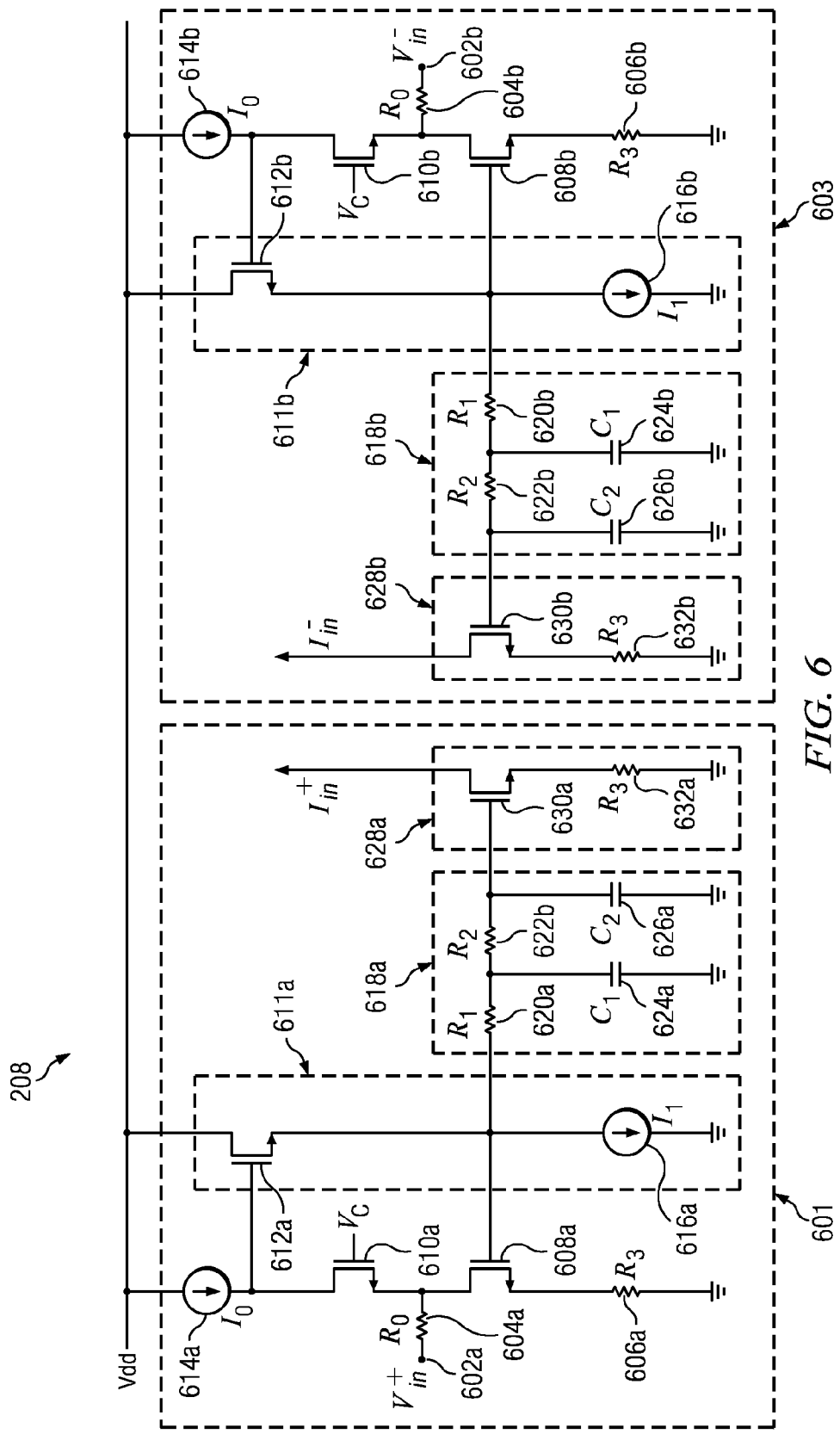
FIG. 6 illustrates an example embodiment of a voltage-to-current (V-I) converter, in accordance with some embodiments of the present disclosure.

FIG. 6 illustrates an example embodiment of a V-I converter 208, according to the present disclosure. Converter 208 may include a positive polarity path 601 and a negative polarity path 603. Positive polarity path 601 may be configured to convert a positive polarity voltage signal ($V_{in}^+$) into a positive polarity current signal ($I_{in}^+$). Negative polarity path 603 may be similarly configured to convert a negative polarity voltage signal ($V_{in}^-$) into a negative polarity current signal ($I_{in}^-$).

For example, positive polarity path 601 may include input node 602a coupled to the output of a filter 206 (shown in FIG. 2) and configured to receive a positive polarity voltage signal ($V_{in}^+$) from the filter 206. Input node 602a may be coupled to one end of a resistor 604a having a resistance of $R_0$. The other end of resistor 604a may be coupled to the drain of a transistor 608a and the source of a transistor 610a. The drain of transistor 610a may be coupled to a current source 614a configured to provide a positive bias current $I_0$ that may be used to bias output signal current $I_{in}^+$, as mentioned above. Additionally, a current signal associated with $V_{in}^+$ and resistor 604a may flow through resistor 604a from input node 602a to the drain of transistor 608a. This current may be referred to as the signal current ($I_{sig}^+$) and may change according to changes in $V_{in}^+$. Accordingly, the current flowing from the drain to source of transistor 608a may be a combination of currents $I_0$ and $I_{sig}^+$.

Path 601 may be configured such that positive polarity current $I_{in}^+$ output by converter 208 may be at least partially a function of $I_0^+$ and $I_{sig}^+$ flowing from the drain to source of transistor 608a. For example, transistor 608a and transistor 630a may be configured as a current mirror such that the current flowing through transistor 630a may be a function of the current flowing through transistor 608a. The current passing through transistor 630a may be current $I_{in}^+$ and, as discussed above, the current flowing through transistor 608a may be a combination of currents $I_0^+$ and $I_{sig}^+$. Therefore, $I_{in}^+$ may be a function of $I_0^+$ and $I_{sig}^+$.

The source of transistor 610a may be coupled to the drain of transistor 608a and the gate of transistor 610a may be coupled to a constant voltage Vc. Additionally, the drain of transistor 610a may be coupled to current source 614. Accordingly, transistor 610a may be configured to reduce the input impedance with respect to the signal associated with received at input node 602a.

Positive polarity path 601 may also include a source follower 611a that includes a transistor 612a. The drain of transistor 612a may be coupled to supply voltage Vdd, the source of transistor 612a may be coupled to the gate of transistor 608a and the gate of transistor 612a may be coupled to the drain of transistor 610a. Therefore, transistor 612a may be configured to lift the drain voltage of transistor 610a, which may also lift the drain voltage of transistor 608a such that transistors 608a and 610a may operate in saturation.

Source follower 611a may also include a current source 616a configured to bias transistor 612a with a current $I_1$. Current source 616a may be configured such that current $I_1$ is at a desired level to bias the drain voltage of transistor 610a according to the desired design characteristics and parameters of transmitter 200 associated with converter 208.

As mentioned above, fluctuations in cause fluctuations in $I_{sig}^+$, which may cause fluctuations in the voltage at the gate of transistor 608a. Some of the fluctuations in $V_{in}^+$ may be caused by noise introduced by the filter 206 coupled to converter 208. Therefore, converter 208 may include a filter 618a configured to filter out at least part of the noise associated with $V_{in}$. In the current example, filter 618a may comprise a passive resistor/capacitor (RC) filter configured to filter out noise that may be associated with $V_{in}^+$. In the present embodiment, filter 618a may comprise resistors 620a and 622a, and capacitors 624a and 626a. Resistors 620a and 622a may have resistances $R_1$ and $R_2$, respectively, and capacitors 624a and 626a may have capacitances $C_1$ and $C_2$, respectively. Resistances $R_1$ and $R_2$ and capacitances $C_1$ and $C_2$ may be selected according to the various design constraints and considerations of converter 208 and transmitter 200 associated with converter 208 to filter the desired amount of noise.

Also, as described earlier, transistor 630a may be included in a current mirror with transistor 608a. Accordingly the gate of transistor 630a may be coupled to the output of filter 618a, while the gate of transistor 608a may be coupled to the input of filter 618a. Capacitors 624a and 626a may cause the DC voltage at the gates of transistors 608a and 630a to be approximately the same. Additionally, the source of transistor 630a may be coupled to a resistor 632a with a resistance substantially equal to $R_3$, the resistance of resistor 606a coupled to the source of transistor 608a. Resistor $R_3$ may be used to reduce the effect of flicker noise. Therefore, the source voltage of both transistors 608a and 630a may be approximately the same such that the gate to source voltage (Vgs) of transistors 608a and 630a may be substantially equal such that transistors 608a and 630a may create a current mirror.

The relationship between the currents flowing through transistors 608a and 630a may be at least a function of the ratio of the width to length (W/L) ratios of transistors 630a and 608a. As such, in the current example, if transistors 608a and 630a have approximately the same width to length ratio, the current passing through transistor 630a ($I_{in}^+$) may be approximately equal to the current passing through transistor 608a (a combination of bias current $I_0^+$ and signal current $I_{sig}^+$).

Additionally, the linearity of the V-I conversion of converter 208 may be at least partially a function of the width to length ratio of transistors 608a and 630a. The larger the width to length ratios of transistors 608a and 630a, the greater the linearity of the conversion may be. However, the larger ratio may also cause more noise in the system. Therefore, the width to length ratios of transistors 608a and 630a may be determined based on the linearity and noise tolerances associated with signals passing through converter 208, and their associated transmission protocols, as described in further detail below.

In some embodiments, positive polarity path 601 may include a plurality of segments 628a that each include a transistor 630a and a resistor 632a. The segments 628a may be coupled in parallel with each other and may be enabled and disabled (e.g., by controller 211 of FIG. 2) such that "M" number of segments are mirroring the current passing through transistor 608a. Accordingly, in such embodiments, $I_{in}^+$ may be approximately equal to the combination of $I_0^+$ and $I_{sig}^+$ scaled by a factor of "M" to adjust $I_{in}^+$ for signal power adjustment, as mentioned above.

Therefore, positive polarity path 601 may be configured to convert positive polarity voltage signal $V_{in}^+$ into positive polarity current signal $I_{in}^+$ biased at a desired level. Negative polarity path 603 may be similarly configured to convert negative polarity voltage signal $V_{in}^-$ into negative polarity current signal $I_{in}^-$ biased at a desired level.

Modifications, additions or omissions may be made to V-I converter 208 without departing from the present disclosure. For example, various transistor configurations may be made to obtain the desired voltage to current conversion. Additionally, in some instances V-I converter 208 may not include filters 618, or filters 618 may be configured differently. Further, as disclosed in FIG. 7, in some instances V-I converter 208 may include another filter configured to filter noise that may be associated with current source 614.

Figure 7:
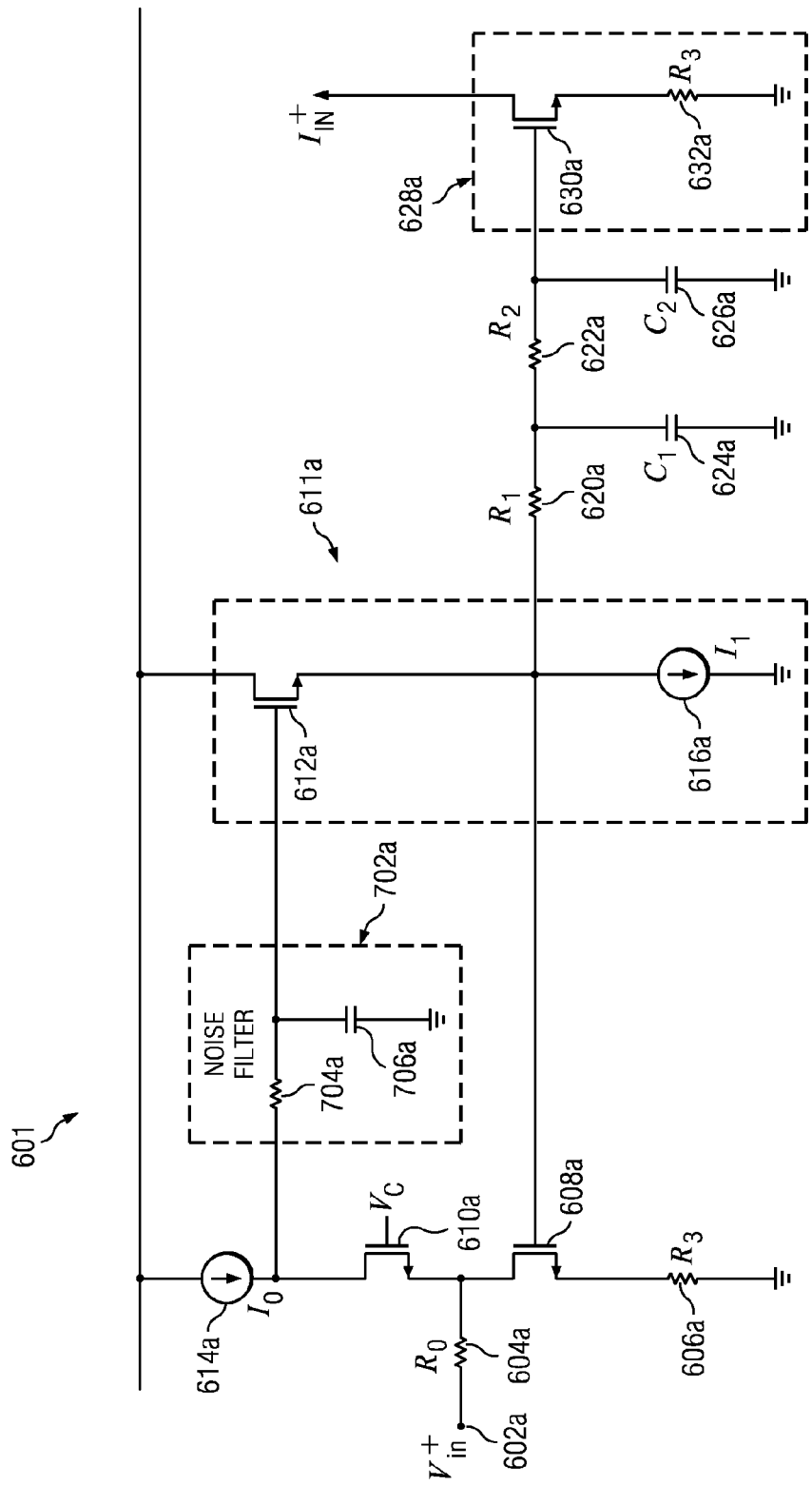
FIG. 7 illustrates an example of a positive polarity path of a V-I converter that may include a noise filter, in accordance with some embodiments of the present disclosure.

FIG. 7 illustrates an example embodiment of positive polarity path 601 of a V-I converter 208 that may include a noise filter 702a configured to filter noise associated with current source 614a, in accordance with some embodiments of the present disclosure. In the present example, noise filter 702a may be coupled between current source 614a and the gate of transistor 612a of source follower 611a. Noise filter 702a may comprise an RC filter with a resistor 704a and a capacitor 706a. Resistor 704a and capacitor 706a may be configured to have a resistance and capacitance, respectively, to achieve a desired corner frequency of filter 702a to filter out at least a portion of the noise associated with current source 614a.

Therefore, positive polarity path 601 may be configured to filter noise associated with current source 614a. Although it is not depicted in FIG. 7, it is understood that a negative polarity path 603 of a V-I converter 208 may include a noise filter 702b, substantially similar to noise filter 702a.

Accordingly, FIGS. 2-7 illustrate an example embodiment of a transmitter 200 that may include various components (e.g., V-I converters 208, attenuator 230) that may have various configurations. In addition to the various components of transmitter 200 having various configurations, transmitter 200 itself may have various configurations as illustrated in FIGS. 8-12.

Figure 8:
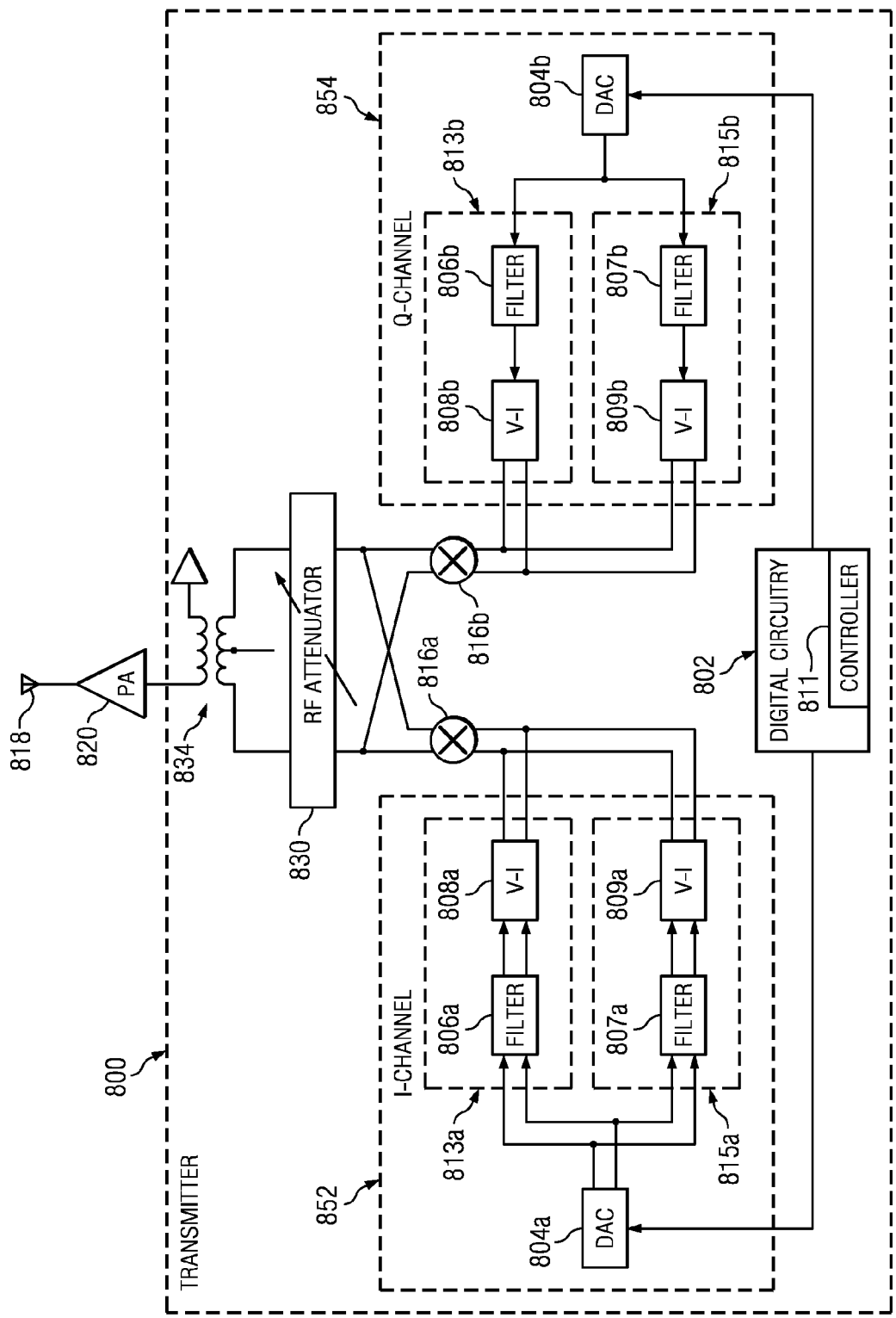
FIG. 8 illustrates an example of a transmitter configured to have a plurality of paths with each path associated with a transmission protocol, in accordance with some embodiments of the present disclosure.

FIG. 8 illustrates a transmitter 800 configured to have a plurality of paths with each path associated with a transmission protocol, in accordance with some embodiments of the present disclosure. In the present example, transmitter 800 may include a path configured for communications associated with a 2G transmission protocol (e.g., GSM, EDGE, GMSK, GPRS, etc.) and a separate path configured for communications associated with a 3G and/or 4G (3G/4G) protocol (e.g., CDMA, WCDMA, LTE). A 2G protocol may have a low noise tolerance, but may not require as much linearity, therefore the 2G path may be configured as a low noise path as described in further detail below. Conversely, a 3G/4G protocol may have a higher noise tolerance than a 2G protocol such that the path associated with the 3G/4G protocol may be configured to have a higher linearity than the 2G path.

In the present example, transmitter 800 may include digital circuitry 802 that may include a controller 811. Digital circuitry 802 and controller 811 may be similar to digital circuitry 202 and controller 211 of FIG. 2. Similar to as described with respect to digital circuitry 202 of FIG. 2, digital circuitry 802 may be configured to transmit components of a signal via an in-phase (I-channel) path 852 and a quadrature-phase (Q-channel) path 854. I-channel path 852 may include a DAC 804a configured to receive the I-channel signal component, and Q-channel path 854 may include a DAC 804b configured to receive the Q-channel signal component. DAC 804a may be similar to DAC 204a of FIG. 2 and DAC 804b may be similar to DAC 204b of FIG. 2.

Additionally, I-channel path 852 may include a high linearity path 813a and a low-noise path 815a. Q-channel path 854 may similarly include a high linearity path 813b and a low noise path 815b. High linearity paths 813 may be configured to have a high linearity and thus may be configured to communicate signals associated with 3G and/or 4G communications protocols. Low noise paths 815 may be configured to have a low noise and thus may be configured to communicate signals associated with 2G communications protocols.

For example, high linearity path 813a may include a filter 806a configured to receive a 3G/4G signal from DAC 804a and filter out noise associated with DAC 804a. Filter 806a may be substantially similar to filter 206a of FIG. 2. Filter 806a may be configured to communicate the 3G/4G signal to V-I converter 808a. V-I converter 808a may comprise a configuration similar to a converter 208 as described with respect to FIGS. 6 and 7. Accordingly, as described above, the transistors that comprise the current mirror of converter 808a (e.g., transistors similar to transistors 608 and 630 of FIG. 6) may be configured to have a width to length ratio such that the linearity of converter 808a is at a desired level of linearity for the 3G/4G signal. High linearity path 813b may be similarly configured for Q-channel path 854.

Additionally, low noise path 815a may include a filter 807a configured to receive a 2G signal from DAC 804a and filter out noise associated with DAC 804a. Filter 807a may be substantially similar to filter 806a. Filter 807a may be configured to communicate the filtered 2G signal to V-I converter 809a, which may comprise a configuration similar to a converter 208 as described with respect to FIGS. 6 and 7. Accordingly, as described above, the transistors that comprise the current mirror of converter 809a (e.g., transistors similar to transistors 608 and 630 of FIG. 6) may be configured to have a width to length ratio such that the noise of converter 809a is at a certain level for the 2G signal. Low noise path 815b may be similarly configured for Q-channel path 854.

V-I converters 808 and 809 may be configured to communicate the RF current signals to mixers 816a and 816b, which may be similar to mixers 216a and 216b of FIG. 2. Mixers 816a and 816b may communicate the signal to an attenuator 830 and balun 834, which may communicate the RF signal to power amplifier 820 and antenna 818 for transmission. Attenuator 830 may comprise a DVCA such as DVCA's 300, 400 or 500 of FIGS. 3, 4 and 5, respectively. Balun 834 may comprise a transformer and may be substantially similar to balun 234 of FIG. 2.

Low noise paths 813 and high linearity paths 815 may be enabled and disabled by controller 811 according to the type of signal that is to be transmitted by transmitter 800. For example, when transmitter 800 is to transmit a 3G/4G signal, controller 811 may close a switch (not expressly shown) coupled between DAC 804a and filter 806a and may open a switch (not expressly shown) coupled between DAC 804a and filter 807a. Therefore, the 3G/4G signal may propagate through high linearity path 813a and not through low noise path 815a. Conversely, when transmitter 800 is to transmit a 2G signal, controller 811 may close the switch coupled between DAC 804a and filter 807a and may open the switch coupled between DAC 804a and filter 806a, such that the 2G signal propagates through low noise path 815a and not through high linearity path 813a. High linearity path 813b and low noise path 815b may be similarly configured.

Therefore, transmitter 800 may be configured to have multiple paths configured for different transmission protocols. Because the transmission protocols may have different design constraints and considerations (e.g., low noise, high linearity), transmitter 800 may be configured such that the transmission protocols may be more efficiently transmitted because their associated paths may be better configured according to the transmission protocols.

Modifications, additions or omissions may be made to transmitter 800 without departing from the scope of the present disclosure. For example, V-I converters 808 and 809 may be configured such that they share the same filter that may be used to filter noise associated with a DAC 804 (e.g., a filter 618 of FIG. 6). Additionally, transmitter 800 may include a voltage selector circuit configured to adjust the bias voltage of balun 834, similar to voltage selector circuit 240 of FIG. 2. Further, transmitter 800 may include a plurality of bias current sources configured to bias various nodes of transmitter 800 similar to bias current sources 222, 224 and 226 described with respect to FIG. 2. Further, as described with respect to FIG. 9, a path associated with a transmission protocol (e.g., a path 813 and/or path 815) may be configured as a current-mode circuit such that the path does not include a V-I converter.

Figure 9:
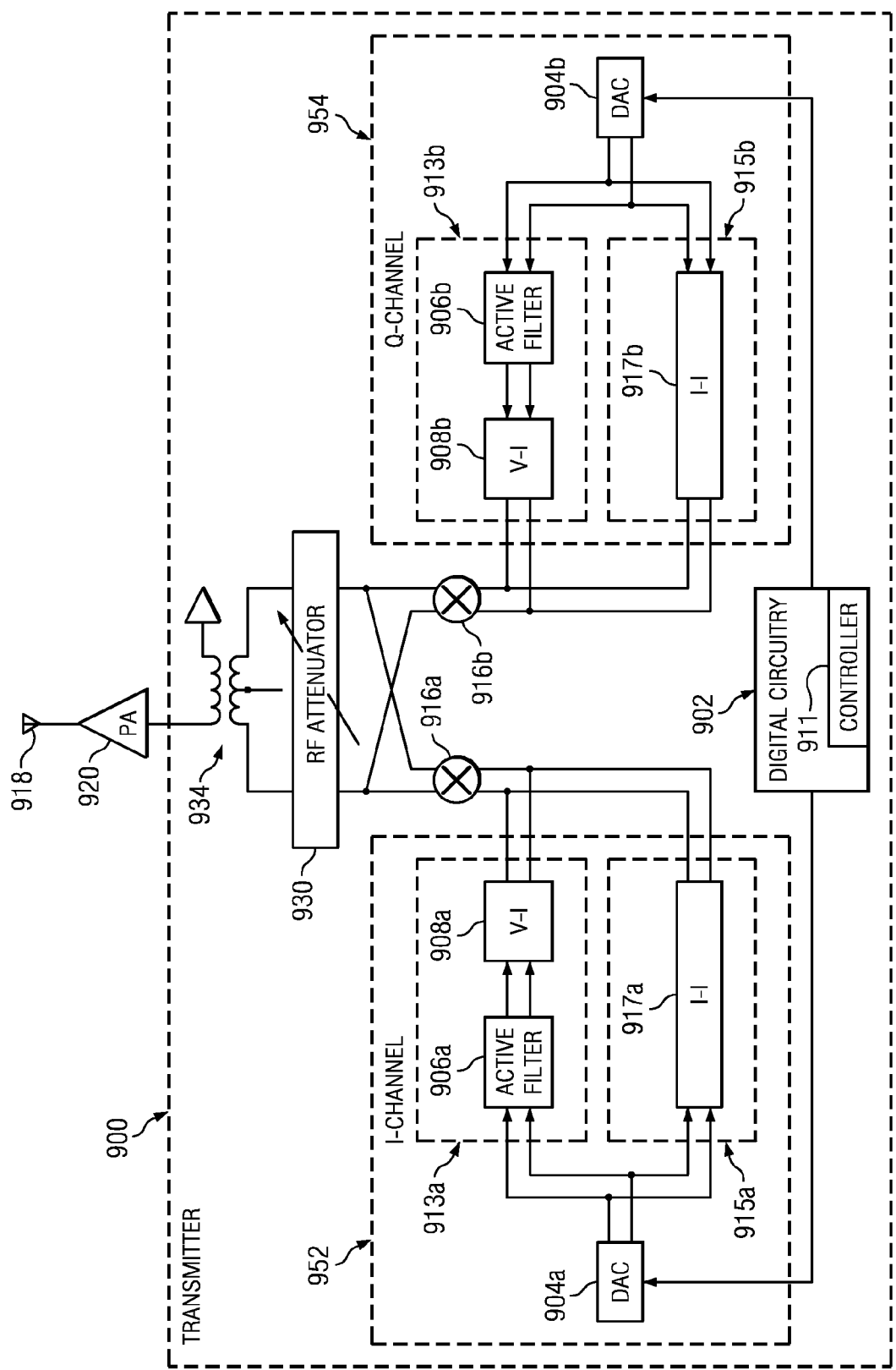
FIG. 9 illustrates an example transmitter that may include a current-mode amplifier circuit configured to provide a low noise path for a transmitter, in accordance with some embodiments of the present disclosure.

FIG. 9 illustrates an example transmitter 900 that may include a current-mode amplifier circuit configured to provide a low noise path for transmitter 900, in accordance with some embodiments of the present disclosure. As disclosed in further detail below, a current-mode amplifier circuit 917 of transmitter 900 may be configured to provide low input impedance to signals received at amplifier circuit 917 while also creating little to no offset to the output signal.

In the current example, transmitter 900 may include digital circuitry 902 that may include a controller 911 and DAC's 904 associated with an I-channel path 952 and a Q-channel path 954 similar to transmitters 200 and 800 described with respect to FIGS. 2 and 8. Additionally, I-channel path 952 and Q-channel path 954 may each include a high linearity path 913 and a low noise path 915 similar to as described with respect to FIG. 8. Similar to transmitter 800 of FIG. 8, high linearity paths 913 may be configured for 3G/4G transmission protocols and low noise paths 915 may be configured for 2G transmission protocols. Accordingly, controller 911 may enable high linearity paths 913 and disable low noise paths 915 for transmission of signals using 3G/4G transmission protocols and controller 911 may enable low noise paths 915 and disable high linearity paths 913 for transmission of signals using 2G protocols, similar to the enabling and disabling of high linearity paths 813 and low noise paths 815 described with respect to transmitter 800 of FIG. 8.

Further, similar to high linearity paths 815 and low noise paths 813 of FIG. 8, high linearity paths 815 and low noise paths 813 may be coupled to mixers 916 configured to modulate the data signals onto a carrier wave. Mixers 916 may communicate the modulated signals to an attenuator 930, balun 934, power amplifier 920 and antenna 918 similar to attenuator 830, balun 834, power amplifier 820 and antenna 818 of FIG. 8 and described above.

However, unlike in transmitter 800 of FIG. 8, low noise paths 915 may each include a current-mode amplifier circuit (I-I) 917 configured to receive a current signal from a DAC 904 and apply a gain to the current signal. As mentioned above, and described further below, an I-I circuit 917 may additionally be configured to provide a low input impedance to the current signal received from a DAC 904 while also providing little to no offset associated with the bias to the output signal.

Figure 10:
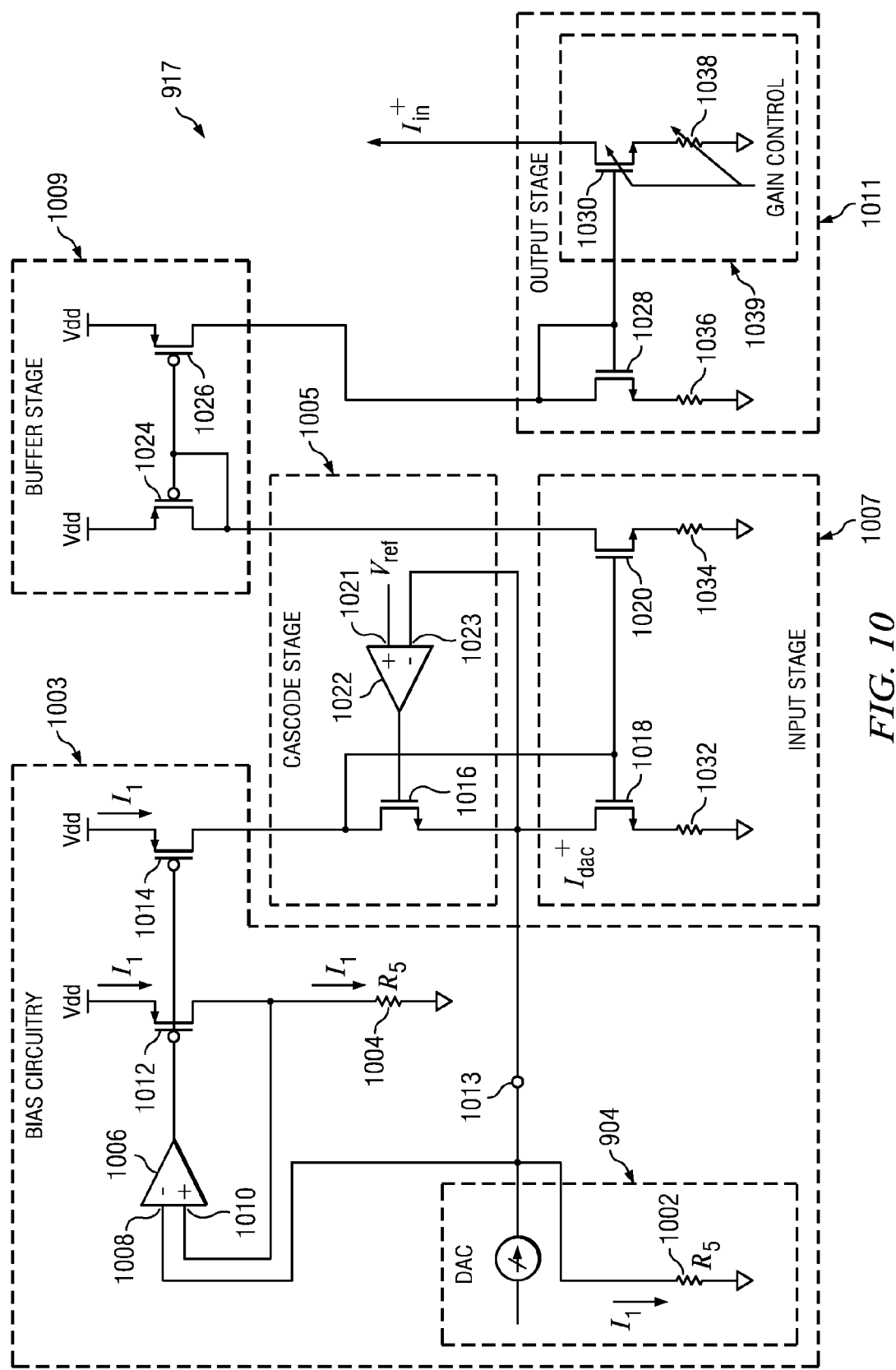
FIG. 10 illustrates an example of a current-mode amplifier circuit, in accordance with certain embodiments of the present disclosure.

FIG. 10 illustrates an example of a current-mode amplifier circuit 917, in accordance with certain embodiments of the present disclosure. Amplifier circuit 917 may be configured to receive a differential current signal ($I_{dac}$) from DAC 904. In the present example, the circuitry for the positive polarity of the received differential current signal ($I_{dac}^+$) is described, however it is understood that amplifier circuit 917 may also include similar circuitry for receiving the negative polarity of the differential current signal ($I_{dac}^-$).

Amplifier circuit 917 may include an input stage 1007 configured to receive $I_{dac}^+$ from DAC 904 and an output stage 1011 configured to apply a gain of "M" to $I_{dac}^+$ such that amplifier circuit 917 may output the current signal $I_{in}^+$ as a function of the gain and $I_{dac}^+$ that may be expressed as the following equation:

$$I_{in}^+ \approx M \times I_{dac}^+$$

As disclosed in further detail below, in order to operate in a linear region, input stage 1007 may be biased at a certain level by bias circuitry 1003 included in amplifier circuit 917. Additionally, amplifier circuit 917 may include a cascode stage 1005 configured such that input stage 1007 has a low input impedance with respect to DAC 904. Accordingly, Input stage 1007, bias circuitry 1003 and cascode stage 1005 may be configured such that input stage 1007 is biased at the proper level, has a low input impedance to allow low input signal levels ($I_{dac}^+$) from DAC 904 to be detected at input stage 1007 while also generating little to no offset to the output signal.

DAC 904 may be configured to communicate $I_{dac}^+$ at a node 1013 of amplifier circuit 917. Input stage 1007 may include a transistor 1018 with its drain coupled to node 1013 such that input stage 1007 may receive $I_{dac}^+$ from DAC 904 via transistor 1018, as described in further detail below. Node 1013 may be biased at a certain level suitable for DAC 904 to bias the drain of transistor 1018 such that transistor 1018 may sink $I_{dac}^+$, but not the bias current, as described below.

The bias voltage of node 1013 may be based on a reference voltage Vref. In the present example, a negative input terminal 1023 of an operational amplifier (op-amp) 1022 of cascode stage 1005 may be coupled to node 1013 and a positive input terminal 1021 of op-amp 1022 may be coupled to Vref. Therefore, the voltage at node 1013 may be approximately equal to Vref. The output impedance of DAC 904 may be represented by a resistor 1002 having a resistance $R_5$ and coupled between node 1013 and ground. Therefore, a current ($I_1$) approximately equal to Vref/$R_5$ may be sunk through DAC 904 (e.g., shown as passing through resistor 1002).

Node 1013 may also be coupled to a negative input terminal 1008 of an op-amp 1006 included in bias circuitry 1003 such that the voltage at negative input terminal 1008 of op-amp 1006 may be approximately equal to Vref. A positive input terminal of op-amp 1006 may be coupled to a resistor 1004 also coupled to ground and having a resistance ($R_5$), matched with the output impedance of DAC 904. Therefore, current $I_1$ approximately equal to Vref/$R_5$ may also pass through resistor 1004.

The output of op-amp 1006 may be coupled to the gate of a PMOS transistor 1012. The source of transistor 1012 may be coupled to a supply voltage Vdd and the drain of transistor 1012 may be coupled to input terminal 1010 and resistor

1004. Therefore, to maintain approximately the same voltage at input terminals 1008 and 1010, op-amp 1006 may drive the gate of transistor 1012 such that current $I_1$ may pass through transistor 1012.

Additionally, the output of op-amp 1006 may be coupled to the gate of a PMOS transistor 1014. The source of transistor 1014 may be coupled to Vdd and op-amp 1006 may drive transistor 1014 with the same gate voltage as transistor 1012. In the present example, transistor 1014 may have approximately the same width to length ratio as transistor 1012 and may be operating in saturation. Therefore, op-amp 1006 may drive transistor 1014 such that a current approximately equal to $I_1$ may also pass through transistor 1014.

The drain of transistor 1014 may be coupled to the drain of an NMOS transistor 1016 configured such that a low input impedance is provided to DAC 904 by transistor 1018 by sourcing current through transistor 1014. The drains of transistors 1014 and 1016 may also be coupled to the gates of NMOS transistor 1018 and NMOS transistor 1020 of input stage 1007. Accordingly, the drain voltages of transistors 1014 and 1016 may also drive the gate voltage of transistors 1018 and 1020.

The gate of transistor 1016 may be coupled to the output of op-amp 1022, and op-amp 1022 may drive transistor 1016 such that current $I_1$ may pass through transistor 1016 and sink through the output impedance of DAC 904 to complete a feedback loop to node 1013. With current $I_1$ passing through transistor 1016 and sinking through the output impedance of DAC 904 (depicted as resistor 1002), transistor 1016 may create a low input impedance to DAC 904. Additionally, with the present configuration, the current forcing characteristics of bias circuitry 1003 and cascode stage 1005, may sink current $I_1$ through the output impedance of DAC 904 and not through transistor 1018 of input stage 1007. Further, due to the current forcing characteristics of bias circuitry 1003 and cascode stage 1005, when DAC 904 sources signal current $I_{dac}^+$, transistor 1018 may sink signal current $I_{dac}^+$, but not current $I_1$. With signal current $I_{dac}^+$ passing through transistor 1018, but little to no current $I_1$ passing through transistor 1018 of input stage 1007, current $I_1$ may cause little to no offset at the output of amplifier circuit 917.

Transistor 1018 may be coupled with a transistor 1020 of input stage 1007, such that input stage 1007 may function as a current mirror. The gates of transistors 1018 and 1020 may be coupled to each other and the sources of transistors 1018 and 1020 may be coupled to resistors 1032 and 1034 respectively. Resistors 1032 and 1034 may also be coupled to ground. In the present example, the resistances of resistors 1032 and 1034 may be approximately equal to each other and the width to length ratios of transistors 1018 and 1020 may also be approximately equal to each other. Accordingly, the current that may pass through transistor 1018 (e.g., $I_{dac}^+$) may also pass through transistor 1020.

In other embodiments, resistors 1032 and 1034 and/or transistors 1018 and 1020 may be sized differently such that the current passing through transistor 1020 is at least partially based on current $I_{dac}^+$, but may also be based on the size differences. Additionally, in some embodiments, a passive RC filter may be coupled between the gates of transistors 1018 and 1020 to filter noise that may be associated with DAC 904 (e.g., a filter similar to filters 618 of FIG. 6, or a filter similar to filter 702a of FIG. 7).

In the present embodiment, the width to length ratio of NMOS transistors 1018 and 1020 of input stage 1007 may be substantially large to allow for a larger swing of input signal $I_{dac}^+$. However, the large width to length ratio may cause the current signal passing through transistor 1020 to have noise associated with it. Accordingly, amplifier circuit 917 may include an output stage 1011 (described in further detail below) separate from input stage 1007. Output stage 1011 may include NMOS transistors 1028 and 1038 having a width to length ratio substantially smaller than that of NMOS transistors 1018 and 1020 to reduce the noise of the output signal (e.g., $I_{in}^+$) output by output stage 1011. Accordingly, by having both input stage 1007 and output stage 1011, amplifier circuit 917 may allow for a larger signal range of input signal while also reducing noise associated with output signal $I_{in}^+$.

To allow for the separation of input stage 1007 from output stage 1011, current amplifier 917 may include buffer stage 1009 that includes PMOS transistors 1024 and 1026. The drain of transistor 1020 of input stage 1007 may be coupled to the drain and gate of a PMOS transistor 1024 of buffer stage 1009. The source of transistor 1024 may be coupled to source voltage Vdd at its source. Therefore, the current passing through transistor 1020 (e.g., $I_{dac}^+$) may also pass through transistor 1024. Buffer stage 1009 may also include a PMOS transistor 1026 coupled to transistor 1024 such that transistors 1024 and 1026 also comprise a current mirror. In the present example, transistors 1024 and 1026 may have approximately the same size such that the current passing through transistor 1024 (e.g., $I_{dac}^+$) may also pass through transistor 1026. In alternative embodiments, transistors 1024 and 1026 may have different width to length ratios such that the current passing through transistor 1026 may at least be a function of the current passing through transistor 1024 (e.g., $I_{dac}^+$) and the ratio of the width to length ratios of transistors 1026 and 1024. Further, in some embodiments, a passive RC filter may be placed between the gates of transistors 1024 and 1026 to filter out unwanted noise.

The drain of transistor 1026 of buffer stage 1009 may be coupled to the drain of an NMOS transistor 1028 of output stage 1011. The source of transistor 1028 may be coupled to a resistor 1036 that may also be coupled to ground. The drain of transistor 1028 may be coupled to the gate of transistor 1028, which also may be coupled to the gate of a transistor 1030 of a segment 1039 that may include a resistor 1038 coupled to the source of transistor 1030 and ground. Therefore, transistor 1030, resistor 1036, transistor 1028 and resistor 1038 may comprise a current mirror. In the present example, transistor 1030 and resistor 1038 may be approximately the same size as transistor 1028 and resistor 1036, respectively. Therefore, the output of segment 1039 may be approximately equal to the current passing through transistor 1028 (e.g., $I_{dac}^+$).

In some embodiments, amplifier circuit 917 may include a plurality of segments 1039 coupled in parallel with each other and transistor 1028. Therefore, in instances where transistors 1030 and resistors 1038 of each segment 1039 are approximately the same size as transistor 1028 and resistor 1036, respectively, "M" number of segments may be enabled and coupled to transistor 1028 according to a gain control signal received from a controller (e.g., controller 911 of FIG. 9) such that a gain of "M" may be applied to $I_{dac}^+$ at output stage 1011 to generate $I_{in}^+$, similarly to the enabling of segments 628 described with respect to FIG. 6.

Therefore, amplifier circuit 917 may be configured to apply a gain of "M" to a current signal $I_{dac}^+$, received from a DAC 904 and output the resulting signal $I_{in}^+$. Additionally, amplifier circuit 917 may be configured such that current signal $I_{dac}^+$ may experience a low input impedance while also reducing or eliminating an offset at the output of amplifier circuit 917.

Modifications, additions or omissions may be made to FIGS. 9 and 10 without departing from the scope of the present disclosure. For example, the sizing of transistors 1030 and resistors 1038 of segments 1039 may be different from the sizing of transistor 1028 and resistor 1036 such that varying degrees of gain "M" may be obtained. Further, any appropriate number of segments 1039 may be included depending on the desired gain of $I_{in}^{+}$ with respect to $I_{dac}^{+}$. Additionally, although the present implementation of current amplifier 917 is depicted in FIG. 9 as being included in a dual path transmitter, it is understood that current amplifier 917 may be included in a single path transmitter. Further, although amplifier circuit 917 has been described as being configured for a low noise path associated with 2G transmission protocols, it is understood that amplifier circuit 917 may be configured for any appropriate transmission protocol. Also, transmitter 900 may include a plurality of bias current sources configured to bias various nodes of transmitter 900 similar to bias current sources 222, 224 and 226 described with respect to FIG. 2. Additionally, although amplifier circuit 917 is described in the context of a wireless transmitter, amplifier circuit 917 may be included and implemented in any suitable application. Further, as disclosed in more detail below with respect to FIGS. 11 and 12, a transmitter, (e.g., transmitter 200, 800 or 900 of FIGS. 2, 8 and 9) may include a plurality of paths configured for a plurality of wavelengths (bands) such that the transmitter may comprise a multi-band transmitter.

Figure 11:
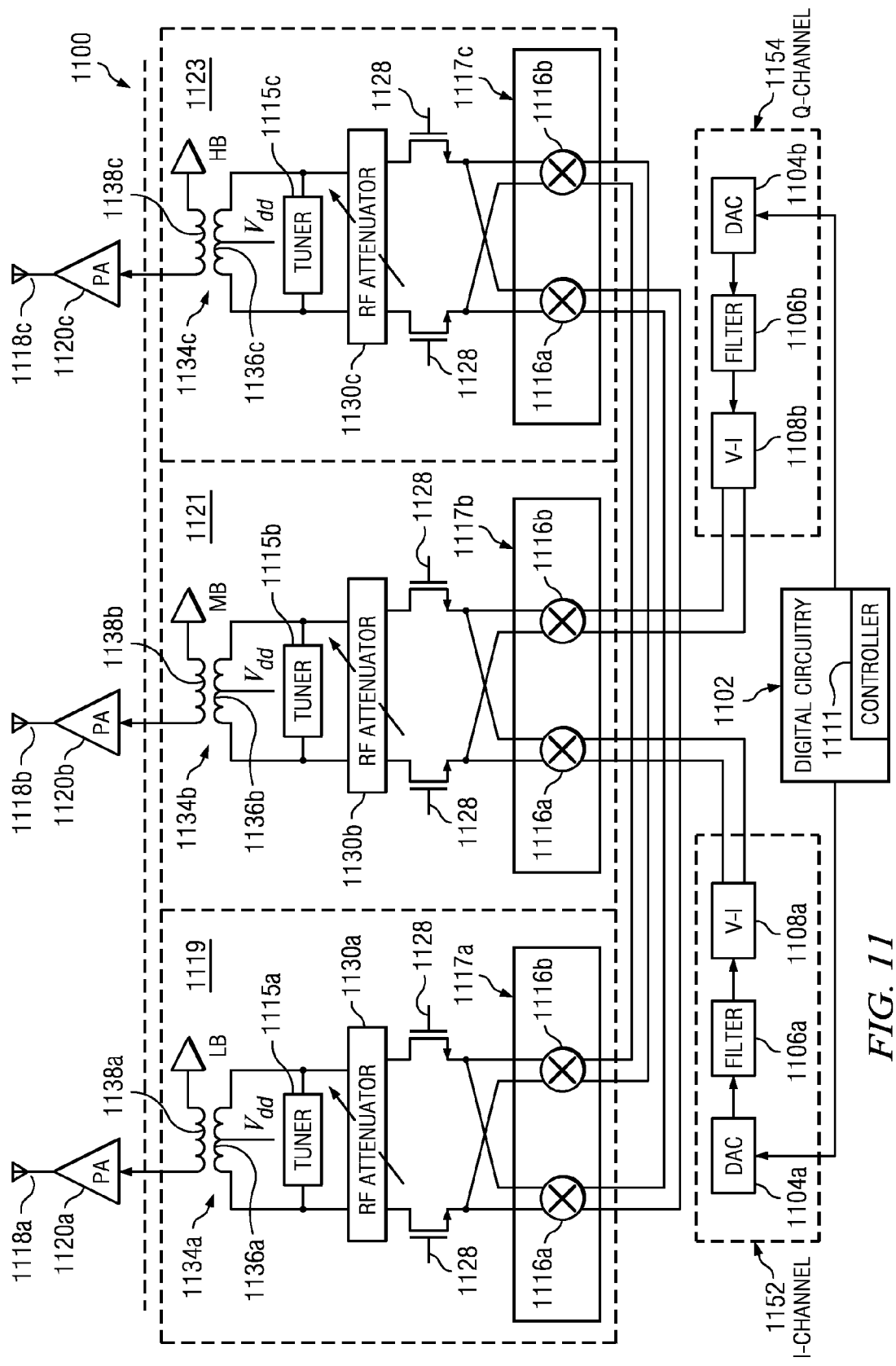
FIG. 11 illustrates an example multi-band transmitter, in accordance with some embodiments of the present disclosure.

FIG. 11 illustrates an example multi-band transmitter 1100, in accordance with some embodiments of the present disclosure. As described in further detail below, transmitter 1100 may include a low-band (LB) path 1119 configured to transmit a low-band signal, a mid-band (MB) path 1121 configured to transmit a mid-band signal and a high-band (HB) path 1123 configured to transmit a high-band signal. Each band path may be coupled to an associated power amplifier 1120 and antenna 1118 configured to transmit the RF signal at the band associated with the band path. In some embodiments, antennas 1118a-1118c may comprise a single multi-band antenna configured to transmit and receive RF signals with wavelengths associated with every band path. In alternative embodiments, antennas 1118a-118c may comprise separate antennas configured to transmit and receive RF signals with frequencies associated with their respective band path. In yet other embodiments, one or more antennas 1118 may be combined as a multi-band antenna, while other antennas 1118 may be separate. Each band path may accordingly be configured for a different frequency range such that each balun for each frequency range may be tuned for that frequency range. Accordingly, noise and loss associated with transmitting within a large frequency band for a single balun may be reduced.

Transmitter 1100 may include digital circuitry 1102 that may include a controller 1111 configured to generate a I-channel and Q-channel components of a digital signal, similar to digital circuitries and controllers described above. Transmitter 1100 may include an I-channel path 1152 and a Q-channel path 1154 that may each include a DAC 1104, filter 1106 and V-I converter 1108.

Additionally, each V-I converter 1108 may each be coupled to a mixer set 1117 of each of low-band path 1119, mid-band path 1121 and high-band path 1123. Each mixer set 1117 may include mixers 1116a and 1116b configured to modulate the I-channel and Q-channel signals onto a carrier signal and to output a differential current signal, as described above. Each band path may include transistors 1128, an attenuator 1130 and a balun 1134 similar to transistors 228, attenuator 230 and balun 234 described above with respect to FIG. 2.

Each balun 1134 may comprise a step-down balun configured such that input coils 1136 may have a higher impedance than output coils 1138 to allow for the desired signal power swings at input coils 1136 without requiring an impedance matching circuit between output coils 1138 and their associated power amplifier 1120. The ratio between the impedance of input coils 1136 and 1138 may be based on the frequencies that may be transmitted by a particular band path. Accordingly, each balun may be configured for its respective band path.

Input coils 1136 may each be coupled to a tuner 1115 configured to tune each balun 1134 to a desired frequency. Tuners 1115 include switches (e.g., transistors) that may be opened and closed according to a control signal received from controller 1111 to tune input coils 1136 to their desired frequency. However, the high impedance of input coils 1136 may create a nonlinear conduction from the drains of the switches to the wells when the switches are in "OFF" state. Accordingly, as described with respect to FIG. 12, the switches of tuners 1115 may be configured such that this OFF-state conduction may not affect the operation of tuners 1115. In contrast, in some traditional configurations, the OFF-state conduction may cause a switch that is supposed to be open to appear at least partially closed, thus, affecting the linearity of the tuner.

Figure 12A:
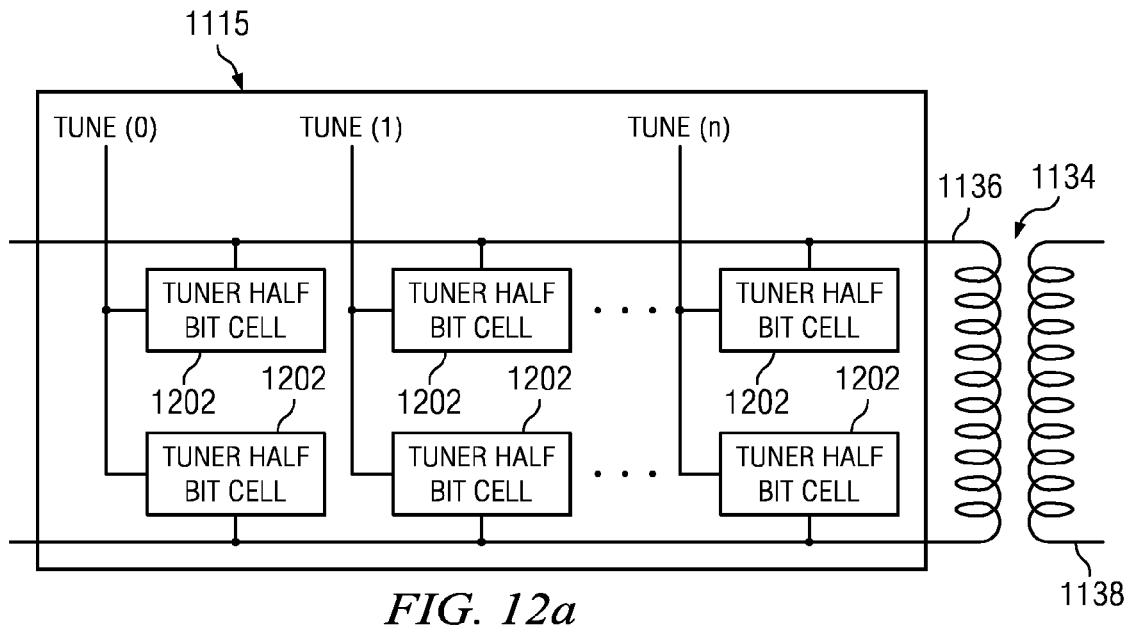
FIGS. 12a and 12b illustrate an example of a tuner of a balun configured to compensate for undesired conduction of switches within the tuner, in accordance with some embodiments of the present disclosure.
Figure 12B:
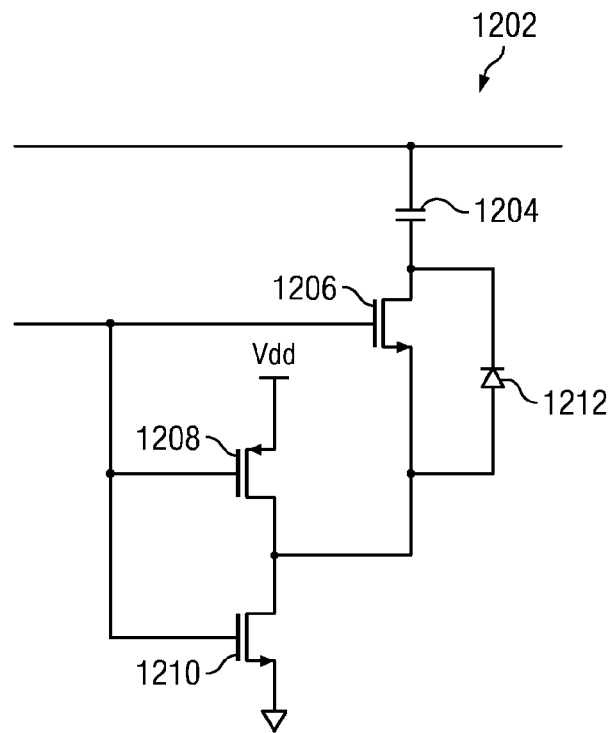

FIGS. 12a and 12b illustrate an example of a tuner 1115 configured to compensate for the OFF-state conduction of switches within a tuner, in accordance with some embodiments of the present disclosure. Tuner 1115 may include a plurality of tuner half bit cells 1202 coupled to controller 1111 and configured to receive a control signal from controller 1111. As discussed further with respect to FIG. 12b, each cell 1202 may include a switch configured to close in response to a "HIGH" control signal received from controller 1111 and open in response to a "LOW" control signal received from controller 1111, such that the electrical properties of input coil 1136 may be adjusted to adjust the impedance of input coil 1136.

FIG. 12b illustrates an example of a cell 1202 configured to compensate for conduction in tuner 1115, in accordance with some embodiments of the present disclosure. Cell 1202 may include a capacitor 1204 coupled to input coil 1136 of balun 1134 and coupled to the drain of an NMOS transistor 1206. The frequency characteristics of tuner 1115 may change according to whether or not capacitor 1204 is coupled to ground. The source of transistor 1206 may be coupled to the drain of a PMOS transistor 1208 and the drain of another NMOS transistor 1210. The source of transistor 1208 may be coupled to a supply voltage Vdd, and the source of transistor 1210 may be coupled to ground. The gates of transistors 1206, 1208 and 1210 may be configured to receive a tune bit control signal from controller 1111 of FIG. 11.

When the tune bit control signal goes "HIGH" transistors 1206 and 1210 may turn on and transistor 1208 may turn off such that capacitor 1204 and the source of transistor 1206 may be substantially coupled to ground through transistor 1210 to tune tuner 1115 accordingly. When the tune bit control signal goes "LOW" transistors 1206 and 1210 may turn off and transistor 1208 may turn on such that capacitor 1204 and the source of transistor 1206 are substantially coupled to supply voltage Vdd.

Parasitic effects associated with cell 1202 may also create a parasitic drain-bulk diode 1212 coupled in parallel with the drain and source of transistor 1206. By configuring cell 1202 such that the source of transistor 1206 is coupled to supply voltage Vdd when transistor 1202 is off, the voltage across drain-bulk diode 1212 may be away from the threshold voltage such that a current may not pass through drain-bulk diode 1212. In contrast, in traditional configurations, a switch's source may be tied to ground when the switch is off and a drain-bulk diode may allow a parasitic drain of current through it because the voltage across the diode may be near the threshold of the drain-bulk diode. Accordingly, traditional configurations may allow for current to bypass the transistor and make it appear as if the transistor is at least partially on, thus, causing non-linear effects in the tuner.

Therefore, tuner 1115 may be configured to compensate for OFF-state conduction that may be associated with switches included in tuner half bit cells 1202. As such, tuner 1115 may be used to tune baluns that may have a high turn ratio on one or more coils (e.g., baluns 1134 with input coils 1136).

Returning to FIG. 11, as described above, with input coils 1134 appropriately tuned, each band path may be configured to transmit a signal at a desired frequency within the band. The separate band paths may also allow for a more custom configuration for each band associated with a band path. For example, the turn ratio of input coil 1136a may be different from the turn ratios of input coils 1136b and 1136c according to the frequencies associated with low-band path 1119.

Modifications, additions or omissions may be made to FIGS. 11 and 12 without departing from the scope of the present disclosure. For example, transmitter 1100 may be configured to have a high linearity path and a low noise path for different transmission protocols as described above. The transmission protocol paths may include an I-V converter in some instances and an I-I amplifier in other instances. Further, transmitter 1100 may include a plurality of bias current sources configured to bias various nodes of transmitter 1100 similar to bias current sources 222, 224 and 226 described with respect to FIG. 2. Additionally, it is understood that although tuner 1115 is described with respect to transmitter 1100, it is understood that tuner 1115 may be included in any suitable tuner, including tuners 200, 800 and 900 described herein.

Although the present disclosure has been described with several embodiments, various changes and modifications may be suggested to one skilled in the art. For example, although certain components may be described and/or depicted as being "coupled" or "communicatively coupled" to each other, it is understood that intermediate components may be included between the "coupled" components. It is intended that the present disclosure encompass such changes and modifications as fall within the scope of the appended claims.

What is claimed is:

1. A multi-band transmitter comprising a plurality of band paths each band path configured for a different frequency range and comprising:
 a modulator configured to modulate a data signal onto a carrier signal associated with the frequency range of the band path to generate a radio frequency (RF) signal associated with the band path and frequency range of the band path;
 a step-down balun including an input coil coupled to the modulator and configured to receive the RF signal from the modulator; and
 a tuner coupled to the input coil of the balun and configured to tune the input coil to the frequency range of the band path and compensate for off-state conduction of switches of the tuner to reduce non-linear tuning effects of the balun associated with the off-state conduction.

2. The transmitter of claim 1, each band path further comprising a supply voltage coupled to the input coil of the balun of the band path and configured to adjust a bias voltage at the input coil according to a power level of the RF signal received at the input coil.

3. The transmitter of claim 1, each band path further comprising a current source coupled to an output of the modulator of the band path and configured to source current to the modulator to at least partially bypass an internal resistance between the output of the modulator and the input coil of the balun of the band path to reduce power consumption associated with the internal resistance.

4. The transmitter of claim 1, further comprising a voltage to current (V-I) converter coupled at an output of the V-I converter to an input of the modulator and configured to convert the data signal from a voltage data signal to a current data signal and communicate the current data signal from the output of the V-I converter to the input of the modulator; and
 a current source coupled at the output of the V-I converter and configured to source current to the V-I converter to at least partially bypass internal resistance between the output of the V-I converter and the input of the modulator to reduce power consumption associated with the internal resistance.

5. The transmitter of claim 4, the V-I converter including a passive filter configured to filter out noise associated with the data signal.

6. The transmitter of claim 4, the V-I converter configured to apply a gain to the data signal.

7. The transmitter of claim 4, further comprising a digital to analog converter (DAC) communicatively coupled to the V-I converter and configured to convert the data signal from a digital data signal into an analog data signal and communicate the analog data signal to the V-I converter.

8. The transmitter of claim 7, further comprising an active filter communicatively coupled between the DAC and V-I converter and configured to filter noise associated with the analog data signal and caused by the DAC.

9. The transmitter of claim 1, further comprising a current mode amplifier coupled at an output of the current mode amplifier to an input of the modulator and configured to:
 receive the data signal;
 apply a gain to the data signal; and
 communicate the data signal with the applied gain from the output of the current mode amplifier to the input of the modulator.

10. A method for multi-band transmission of radio frequency (RF) signals comprising, for each of a plurality of band paths configured for a different frequency range:
 modulating, by a modulator of the band path, a data signal onto a carrier signal associated with the frequency range of the band path to generate a radio frequency (RF) signal associated with the band path and frequency range of the band path;
 receiving, by an input coil of a step-down balun of the band path, the RF signal from the modulator;
 tuning, by a tuner, an input coil of the balun to the frequency range of the band path; and
 compensating for, at the tuner, off-state conduction of switches of the tuner to reduce non-linear tuning effects of the balun associated with the off-state conduction.

11. The method of claim 10, further comprising adjusting a bias voltage of the input coil of each balun according to a power level of the RF signal received at the input coil.

12. The method of claim 10, further comprising sourcing current to at an output of the modulator to at least partially bypass an internal resistance between the output of the modulator and the input coil of the balun to reduce power consumption associated with the internal resistance.

13. The method of claim 10, further comprising converting, by a voltage to current (V-I) converter the data signal from a voltage data signal to a current data signal;
- communicating the current data signal from the (V-I) converter to an input of the modulator; and
- sourcing current to the V-I converter at the output of the V-I converter to at least partially bypass an internal resistance between the output of the V-I converter and the input of the modulator to reduce power consumption associated with the internal resistance.

14. The method of claim 13, further comprising filtering, by the V-I converter, noise associated with the data signal.

15. The method of claim 13, further comprising applying a gain to the data signal by the V-I converter.

16. The method of claim 13, further comprising:
- converting the data signal from a digital data signal into an analog data signal by a digital to analog converter (DAC) communicatively coupled to the V-I converter; and
- communicating, by the DAC, the analog data signal to the V-I converter.

17. The method of claim 16, further comprising filtering, by an active filter communicatively coupled between the DAC and V-I converter, noise associated with the analog data signal and caused by the DAC.

18. The method of claim 10, further comprising:
- receiving the data signal at a current mode amplifier;
- applying a gain to the data signal by the current mode amplifier; and
- communicating the data signal with the applied gain from an output of the current mode amplifier to an input of the modulator.

\* \* \* \* \*